(12) United States Patent
Kong et al.

(10) Patent No.: US 12,040,274 B2
(45) Date of Patent: Jul. 16, 2024

(54) MICROELECTRONIC DEVICES INCLUDING DIFFERENTLY SIZED CONDUCTIVE CONTACT STRUCTURES, AND RELATED MEMORY DEVICES, ELECTRONIC SYSTEMS, AND METHODS

(71) Applicant: Micron Technology, Inc., Boise, ID (US)

(72) Inventors: Lingyu Kong, Singapore (SG); Lifang Xu, Boise, ID (US); Indra V. Chary, Boise, ID (US); Shuangqiang Luo, Boise, ID (US); Sok Han Wong, Singapore (SG)

(73) Assignee: Micron Technology, Inc., Boise, ID (US)

( * ) Notice: Subject to any disclaimer, the term of this patent is extended or adjusted under 35 U.S.C. 154(b) by 266 days.

(21) Appl. No.: 17/314,485

(22) Filed: May 7, 2021

(65) Prior Publication Data
US 2022/0359398 A1 Nov. 10, 2022

(51) Int. Cl.
| | |
|---|---|
| *H10B 41/27* | (2023.01) |
| *H01L 21/768* | (2006.01) |
| *H01L 23/00* | (2006.01) |
| *H01L 23/528* | (2006.01) |
| *H01L 23/535* | (2006.01) |
| *H10B 43/27* | (2023.01) |

(52) U.S. Cl.
CPC ...... *H01L 23/535* (2013.01); *H01L 21/76805* (2013.01); *H01L 21/76895* (2013.01); *H01L 23/528* (2013.01); *H01L 23/562* (2013.01); *H10B 41/27* (2023.02); *H10B 43/27* (2023.02)

(58) Field of Classification Search
CPC ................... H10B 41/00–70; H10B 43/00–50
See application file for complete search history.

(56) References Cited

U.S. PATENT DOCUMENTS

| | | | |
|---|---|---|---|
| 7,501,355 B2* | 3/2009 | Bhatia | H01L 21/76829 438/791 |
| 9,064,576 B2 | 6/2015 | Tanzawa | |
| 9,941,209 B2 | 4/2018 | Tessariol et al. | |
| 10,141,330 B1 | 11/2018 | Lindsay et al. | |
| 10,269,626 B2 | 4/2019 | Ha et al. | |
| 10,381,080 B2 | 8/2019 | Pan et al. | |
| 10,580,795 B1 | 3/2020 | Luo et al. | |
| 2015/0340376 A1* | 11/2015 | Park | H10B 43/27 257/329 |
| 2019/0157291 A1* | 5/2019 | Kam | H10B 43/27 |

(Continued)

*Primary Examiner* — Eric A. Ward
*Assistant Examiner* — Nora Taylor Nix
(74) *Attorney, Agent, or Firm* — TraskBritt

(57) ABSTRACT

A microelectronic device comprises a stack structure comprising insulative structures vertically interleaved with conductive structures, first support pillar structures vertically extending through the stack structure in a first staircase region including steps defined at edges of tiers of the insulative structures and conductive structures, and second support pillar structures vertically extending through the stack structure in a second staircase region including additional steps defined at edges of additional tiers of the insulative structures and conductive structures, the second support pillar structures having a smaller cross-sectional area than the first support pillar structures. Related memory devices, electronic systems, and methods are also described.

15 Claims, 19 Drawing Sheets

(56) References Cited

U.S. PATENT DOCUMENTS

| | | | |
|---|---|---|---|
| 2019/0280000 A1* | 9/2019 | Nakamura | H01L 29/40117 |
| 2020/0105785 A1* | 4/2020 | Jung | H10B 41/27 |
| 2021/0296334 A1* | 9/2021 | Zhang | H10B 41/35 |
| 2021/0320193 A1* | 10/2021 | Yamazaki | H01L 21/823412 |
| 2022/0406709 A1* | 12/2022 | Yang | H01L 23/5283 |

* cited by examiner

MICROELECTRONIC DEVICES INCLUDING DIFFERENTLY SIZED CONDUCTIVE CONTACT STRUCTURES, AND RELATED MEMORY DEVICES, ELECTRONIC SYSTEMS, AND METHODS

TECHNICAL FIELD

The disclosure, in various embodiments, relates generally to the field of microelectronic device design and fabrication. More specifically, the disclosure relates to microelectronic devices and apparatuses including first conductive contact structures having a different dimension than second conductive contact structures, and to related memory devices, electronic systems, and methods of forming the microelectronic devices.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in a stack of tiers of conductive structures (e.g., word lines) and dielectric materials at each junction of the vertical memory strings and the conductive structures. Such a configuration permits a greater number of switching devices (e.g., transistors) to be located in a unit of die area (i.e., length and width of active surface consumed) by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., the word lines) so that memory cells in the vertical memory array can be uniquely selected for writing, reading, or erasing operations. One method of forming such an electrical connection includes forming so-called at least one "staircase" (or "stair step") structure at edges (e.g., horizontal ends) of the tiers of conductive structures. The staircase structure includes individual "steps" providing contact regions of the conductive structures upon which conductive contact structures can be positioned to provide electrical access to the conductive structures.

As vertical memory array technology has advanced, additional memory density has been provided by forming vertical memory arrays to include stacks comprising additional tiers of conductive structures and, hence, additional staircase structures and/or additional steps in individual staircase structures associated therewith. As the height of the stacks increases to facilitate additional memory cells in the vertical memory arrays, the stack may be prone to toppling or collapse during various processing acts. For example, during replacement gate processing acts, the stack may be subject to tier collapse during or after removal of portions of the tiers to be replaced with conductive structures. Collapse of the portions of the stack may reduce reliability of the vertical memory strings.

DETAILED DESCRIPTION

Figure 1A:
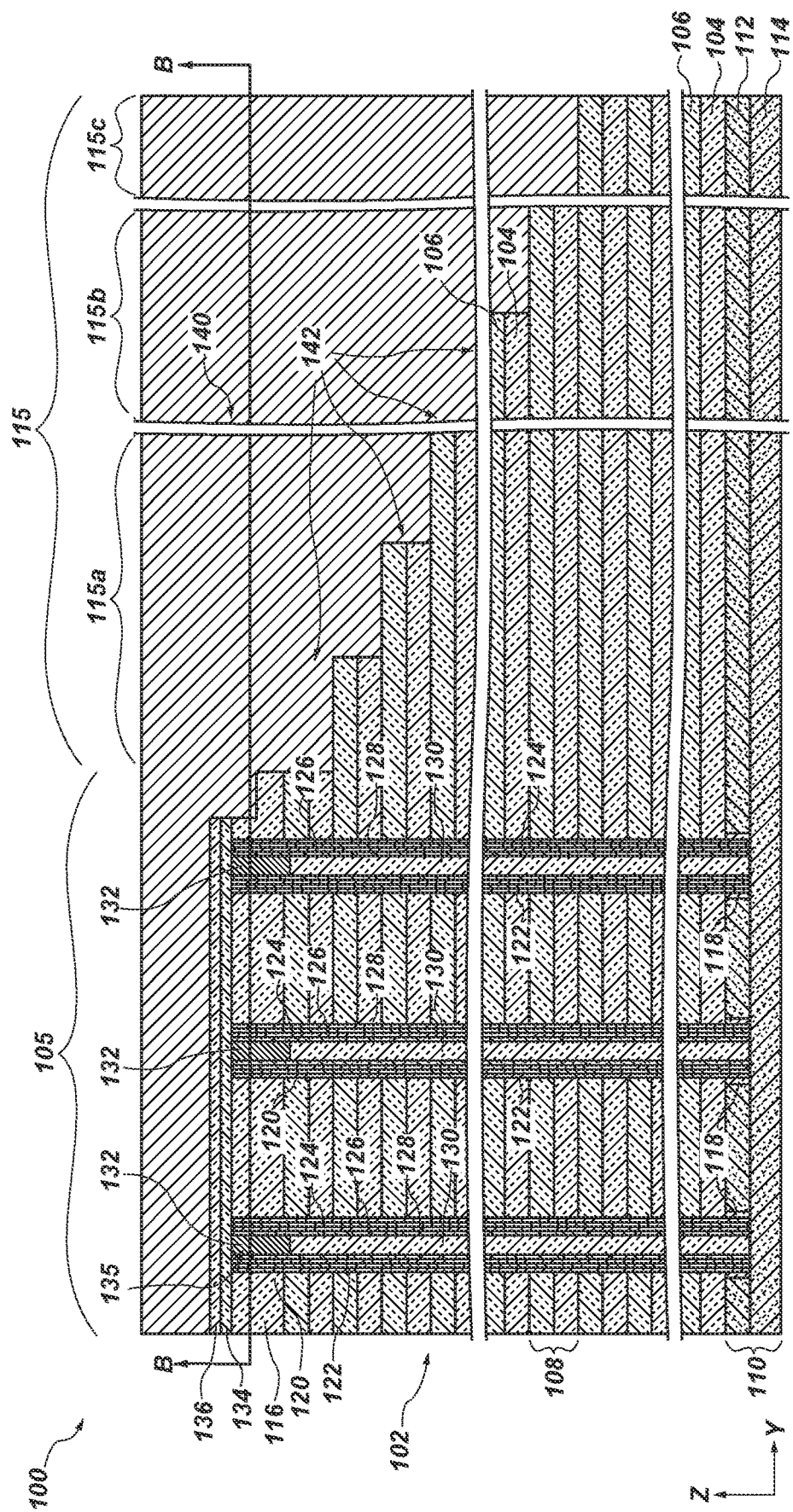
FIG. 1A through FIG. 1O are simplified partial cross-sectional views (FIG. 1A, FIG. 1C, FIG. 1F, FIG. 1I, FIG. 1K, and FIG. 1N) and simplified partial top-down views (FIG. 1B, FIG. 1D, FIG. 1E, FIG. 1G, FIG. 1H, FIG. 1J, FIG. 1L, FIG. 1M, and FIG. 1O) illustrating a method of forming a microelectronic device structure, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device, such as DRAM memory device), apparatus, memory device, or electronic system, or a complete microelectronic device, apparatus, memory device, or electronic system including some conductive structures (e.g., select gate structures) exhibiting a greater conductivity than other conductive structures. The structures described below do not form a complete microelectronic device, apparatus, memory device, or electronic system. Only those process acts and structures necessary to understand the embodiments described herein are described in detail below. Additional acts to form a complete microelectronic device, apparatus, memory device, or electronic system from the structures may be performed by conventional techniques.

Unless otherwise specified, materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

According to embodiments described herein, a microelectronic device comprises a stack structure comprising insulative structures vertically alternating with conductive structures arranged in tiers. The stack structure may be divided into an array region including strings of memory cells vertically extending through the stack structure and a staircase region including one or more staircase structures. Each of the staircase structures may include steps defined at lateral edges of the tiers of the vertically alternating insulative structures and conductive structures. First conductive contact structures may vertically extend through a dielectric material overlying the staircase region and may be in electrical communication with some of the conductive structures at the steps of at least a first staircase structure (e.g., a staircase structure defined by conductive structures employed as upper select gate structures, such as select gate drain (SGD) structures). Second conductive contact structures may vertically extend through the dielectric material and may be in electrical communication with other of the conductive structures at the steps of other (e.g., a second, a third) of the staircase structures. The first conductive contact structures may have a lateral dimension (e.g., a diameter) less than a lateral dimension (e.g., a diameter) of the second conductive contact structures. The first conductive contact structures may have a lateral dimension (e.g., a diameter,) that is substantially the same as a lateral dimension (e.g., a diameter) of conductive contacts in electrical communication with the strings of memory cells and electrically coupling the strings of memory cells to conductive lines (e.g., data lines, such as bit lines). In some embodiments, the first conductive contact structures comprise conductive contact structures for select gate structures, such as SGD structures. In some embodiments, the first conductive contact structures and the second conductive contact structures include a conductive liner material (e.g., a conductive metal nitride liner material). In some embodiments, the second conductive contact structures further include an oxide liner material and the first conductive contact structures do not include the oxide liner material.

In addition, first support pillar structures vertically extend through the stack structure within the at least the first staircase region and second support pillar structures vertically extend through the stack structure within the other staircase structures. The first support pillar structures may have a lateral dimension (e.g., a diameter, a length, a width) that is larger than a lateral dimension (e.g., a diameter, a length, a width,) of the second support pillar structures. The smaller lateral dimension of the first conductive contact structures relative to the lateral dimension of the second conductive contact structures facilitates the larger lateral dimension of the first support pillar structures relative to the lateral dimension of the second support pillar structures. The larger lateral dimension of the first support pillar structures relative to the lateral dimension of the second support pillar structures facilitates a reduced likelihood of tier collapse (e.g., within the at least the first staircase region) of the insulative structures during so-called "gate replacement" or "gate last" processing acts.

Figure 1B:
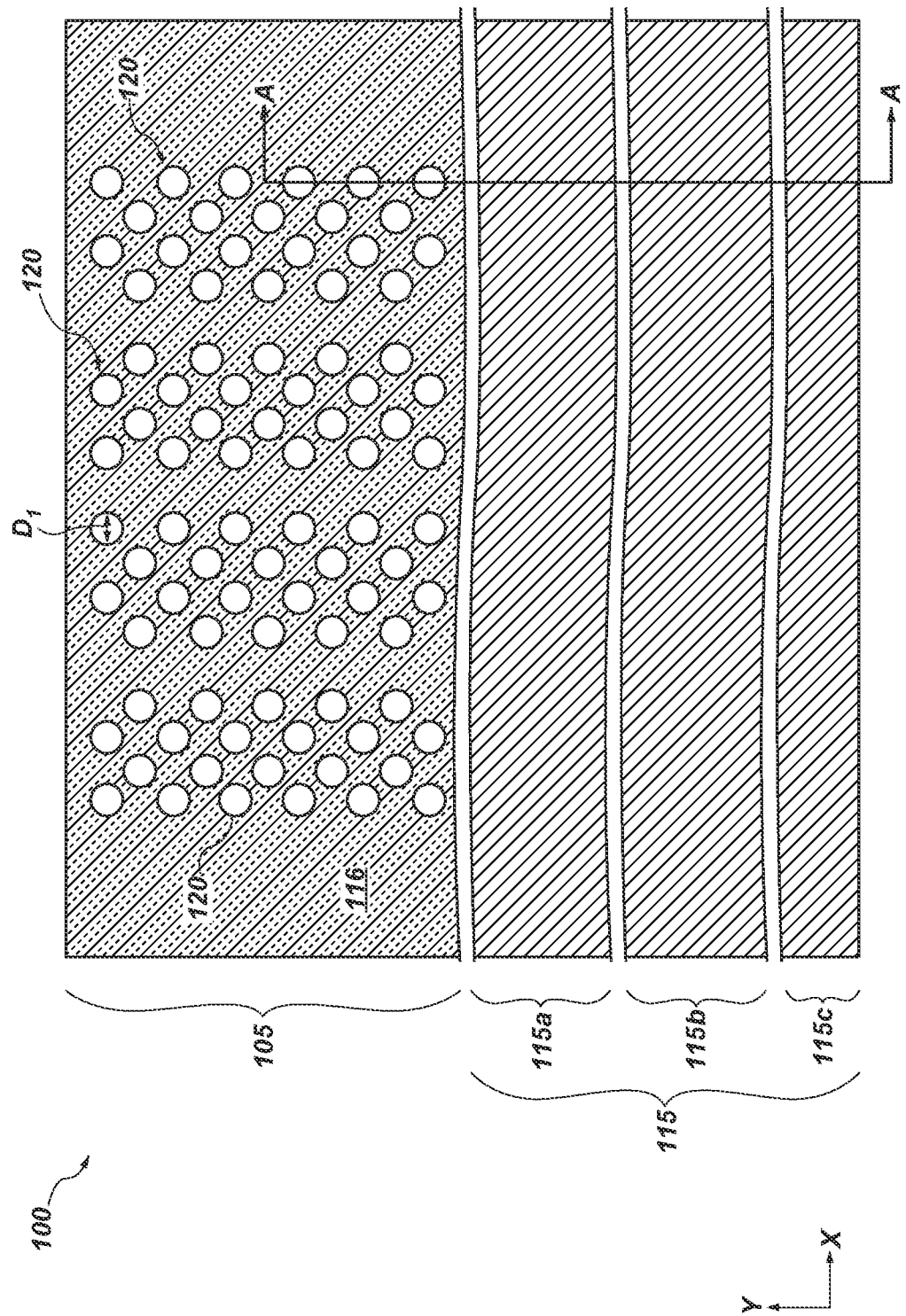

FIG. 1A through FIG. 1O illustrate a method of forming a microelectronic device structure, in accordance with embodiments of the disclosure. FIG. 1A is a simplified cross-sectional view of a microelectronic device structure 100. FIG. 1B is a simplified partial top-down view of the microelectronic device structure 100 taken through section line B-B of FIG. 1A. The microelectronic device structure 100 may, for example, be formed into a portion of a memory device (e.g., a multi-deck 3D NAND Flash memory device, such as a dual deck 3D NAND Flash memory device), as described in further detail below.

With reference to FIG. 1A, the microelectronic device structure 100 includes a stack structure 102 including a vertically alternating (e.g., in the Z-direction) sequence of insulative structures 104 and additional insulative structures 106 arranged in tiers 108. Each of the tiers 108 of the stack structure 102 may include at least one (1) of the insulative structures 104 vertically neighboring at least one (1) of the additional insulative structures 106.

The insulative structures 104 may each individually be formed of and include, for example, an insulative material, such as one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), aluminum oxide ($Al_2O_3$), or a combination thereof), and amorphous carbon. In some embodiments, the insulative structures 104 comprise silicon dioxide. Each of the insulative structures 104 may individually include a substantially homogeneous distribution of the at least one insulating material, or a substantially heterogeneous distribution of the at least one insulating material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the structure. In some embodiments, each of the insulative structures 104 of each of the tiers 108 of the stack structure 102 exhibits a substantially homogeneous distribution of insulative material. In additional embodiments, at least one of the insulative structures 104 of at least one of the tiers 108 of the stack structure 102 exhibits a substantially heterogeneous distribution of at least one insulative material. The insulative structures 104 may, for example, be formed of and include a stack (e.g., laminate) of at least two different insulative materials. The insulative structures 104 of each of the tiers 108 of the stack structure 102 may each be substantially planar, and may each individually exhibit a desired thickness.

The levels of the additional insulative structures 106 may be formed of and include an insulative material that is different than, and exhibits an etch selectivity with respect to, the insulative structures 104. In some embodiments, the additional insulative structures 106 are formed of and include one or more of a nitride material (e.g., silicon nitride ($Si_3N_4$)) and an oxynitride material (e.g., silicon oxynitride). In some embodiments, the additional insulative structures 106 comprise $Si_3N_4$.

Although FIG. 1A illustrates a particular number of tiers 108 of the insulative structures 104 and the additional insulative structures 106, the disclosure is not so limited. In some embodiments, the stack structure 102 includes a desired quantity of the tiers 108, such as within a range from thirty-two (32) of the tiers 108 to two hundred fifty-six (256) of the tiers 108. In some embodiments, the stack structure 102 includes sixty-four (64) of the tiers 108. In other embodiments, the stack structure 102 includes a different number of the tiers 108, such as less than sixty-four (64) of the tiers 108 (e.g., less than or equal to sixty (60) of the tiers 108, less than or equal to fifty (50) of the tiers 108, less than about forty (40) of the tiers 108, less than or equal to thirty (30) of the tiers 108, less than or equal to twenty (20) of the tiers 108, less than or equal to ten (10) of the tiers 108); or greater than sixty-four (64) of the tiers 108 (e.g., greater than or equal to seventy (70) of the tiers 108, greater than or equal to one hundred (100) of the tiers 108, greater than or equal to about one hundred twenty-eight (128) of the tiers 108, greater than two hundred fifty-six (256) of the tiers 108) of the insulative structures 104 and the additional insulative structures 106. In addition, in some embodiments, the stack structure 102 overlies a deck structure comprising additional tiers 108 of insulative structures 104 and the additional insulative structures, separated from the stack structure 102 by at least one dielectric material, such as an interdeck insulative material.

With continued reference to FIG. 1A, the microelectronic device structure 100 further includes a source tier 110 vertically underlying (e.g., in the Z-direction) the stack structure 102. The source tier 110 may comprise, for example, a first source material 112 and a second source material 114. The first source material 112 may be formed of and include at least one conductive material, such as one or more of a metal (e.g., W, Ti, Mo, Nb, V, Hf, Ta, Cr, Zr, Fe, Ru, Os, Co, Rh, Ir, Ni, Pd, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy), a conductive metal-containing material (e.g., a conductive metal nitride, a conductive metal silicide, a conductive metal carbide, a conductive metal oxide), and a doped semiconductor material (e.g., polysilicon doped with one or more P-type dopants, such as one or more of boron, aluminum, and gallium; polysilicon doped with one or more N-type conductivity materials, such as one or more of arsenic, phosphorous, antimony, and bismuth). In some embodiments, the first source material 112 comprises conductively-doped silicon.

The second source material 114 may be formed of and include one or more of a metal silicide material (e.g., tungsten silicide ($WSi_x$)), a metal nitride material (e.g., tungsten nitride), and a metal silicon nitride material (e.g., tungsten silicon nitride ($WSi_xN_y$)). In some embodiments, the second source material 114 comprises tungsten silicide.

The microelectronic device structure 100 may include an array region 105 and a distributed staircase region 115 laterally neighboring (e.g., in the Y-direction) the array region 105. As will be described herein, the array region 105 may include vertical (e.g., in the Z-direction) strings (e.g., strings 172 (FIG. 1I)) of memory cells (e.g., memory cells 174 (FIG. 1I)) vertically extending through the stack structure 102.

The distributed staircase region 115 may include one or more staircase regions, such as at least a first staircase region 115a, a second staircase region 115b, and a third staircase region 115c. The first staircase region 115a may be a laterally (e.g., in the Y-direction) terminal staircase region of the distributed staircase region 115 and the third staircase region 115c may be a laterally (e.g., in the Y-direction) terminal staircase region of the distributed staircase region 115. The first staircase region 115a, the second staircase region 115b, and the third staircase region 115c may collectively be referred to herein as "staircase regions 115."

Although FIG. 1A illustrates only three staircase regions 115 (the first staircase region 115a, the second staircase region 115b, and the third staircase region 115c) the disclosure is not so limited. In other embodiments, the microelectronic device structure 100 may include greater than three (3) (e.g., greater than four (4), greater than eight (8), greater than twelve (12)) staircase regions, such as sixteen (16) staircase regions. For example, the second staircase region 115b (i.e., the staircase regions between laterally terminal staircase regions) may include more than one (1) staircase region (e.g., more than four (4) staircase regions, more than eight (8) staircase regions, more than twelve (12) staircase regions).

Each of the first staircase region 115a, the second staircase region 115b, and the third staircase region 115c may include at least one staircase structure 140 including steps 142 (e.g., contact regions) defined by lateral edges (e.g., ends) of the tiers 108. As will be described herein, the staircase structure 140 of the first staircase region 115a and the third staircase region 115c may include select gate structures (SGS), such as select gate drain (SGD) structures and may be referred to herein as select gate drain staircase structures.

Laterally (e.g., in the Y-direction) neighboring staircase regions 115 may be separated from each other by relatively vertically elevated regions (e.g., elevated regions 340 (FIG. 3)) not including steps 142. For example, the first staircase region 115a may be separated from the second staircase region 115b by a first vertically elevated region (e.g., elevated regions 340 (FIG. 3)) not including steps 142; and the second staircase region 115b may be separated from the third staircase region 115c by a second relatively vertically elevated region also not including steps 142.

The total quantity of steps 142 included in the distributed staircase region 115 may be substantially the same as (e.g., equal to) or may be different than (e.g., less than, greater than) the quantity of tiers 108 in the stack structure 102. As shown in FIG. 1A, in some embodiments, the steps 142 of each of the staircase structure 140 are arranged in order, such that steps 142 directly horizontally neighboring one another in the Y-direction correspond to tiers 108 of the stack structure 102 directly vertically adjacent (e.g., in the Z-direction) one another. In additional embodiments, the steps 142 of at least one of the staircase structures 140 are arranged out of order, such that at least some steps 142 of the staircase structure 140 directly horizontally adjacent one another in the Y-direction correspond to tiers 108 of stack structure 102 not directly vertically adjacent (e.g., in the Z-direction) one another.

A dielectric material 116 may vertically (e.g., in the Z-direction) overlie a vertically uppermost tier 108 of the insulative structures 104 and the additional insulative structures 106. The dielectric material 116 may comprise one or more of the materials described above with reference to the insulative structures 104. In some embodiments, the dielectric material 116 comprises silicon dioxide.

With continued reference to FIG. 1A and FIG. 1B, pillars 120 may vertically (e.g., in the Z-direction) extend through the stack structure 102. In some embodiments, the pillars 120 extend at least partially into the source tier 110 (e.g., at least partially into the first source material 112).

The pillars 120 may have a horizontal dimension (e.g., diameter) $D_1$ (FIG. 1B) within a range of from about 60 nanometers (nm) to about 120 nm, such as from about 60 nm to about 80 nm, from about 80 nm to about 100 nm, or from about 100 nm to about 120 nm. In some embodiments, the horizontal dimension $D_1$ is about from about 80 nm to about 100 nm. However, the disclosure is not so limited and the horizontal dimension $D_1$ may be different than those described.

Referring to FIG. 1B, pillars 120 that laterally neighbor one another in the Y-direction may be offset from each other in the X-direction. Accordingly, the pillars 120 may be arranged in a so-called weave pattern, which may facilitate an increased density of the pillars 120 (and resulting strings (e.g., strings 172 (FIG. 1I)) of memory cells (e.g., memory cells 174 (FIG. 1I))) to be formed from the pillars 120. However, the disclosure is not so limited and the pillars 120 may be arranged in other patterns (e.g., lines wherein the pillar 120 of each line are aligned with pillars 120 of each of the other lines). In some embodiments, each pillar 120 may be surrounded by six (6) other pillars 120 and may be arranged in a hexagonal pattern.

The distance between the pillars 120 in FIG. 1A is exaggerated for clarity and ease of understanding the description. It will be understood that the lateral (e.g., in the Y-direction) distance between the pillars 120 may be less than that illustrated in FIG. 1A, such as the relative distance illustrated in FIG. 1B.

The materials of the pillars 120 may be employed to form memory cells (e.g., vertically extending strings of NAND memory cells). With reference to FIG. 1A, the pillars 120 may each individually comprise a charge blocking material (also referred to as a "dielectric blocking material") 122 horizontally neighboring the levels of the insulative structures 104 and the additional insulative structures 106 of one of the tiers 108 of the stack structure 102; a memory material 124 horizontally neighboring the charge blocking material 122; a tunnel dielectric material (also referred to as a "tunneling dielectric material") 126 horizontally neighboring the memory material 124; channel material 128 horizontally neighboring the tunnel dielectric material 126; and an insulative material 130 horizontally neighboring the channel material 128 and in a center portion of the pillars 120. The channel material 128 may be horizontally interposed between the insulative material 130 and the tunnel dielectric material 126; the tunnel dielectric material 126 may be horizontally interposed between the channel material 128 and the memory material 124; the memory material 124 may be horizontally interposed between the tunnel dielectric material 126 and the charge blocking material 122; and the charge blocking material 122 may be horizontally interposed between the memory material 124 and the levels of the insulative structures 104 and additional insulative structures 106. The charge blocking material 122, the memory material 124, and the tunnel dielectric material 126 may collectively be referred to herein as "memory cell materials."

Referring to FIG. 1B, for clarity and ease of understanding of the description, in FIG. 1B, the pillars 120 are illustrated without the charge blocking material 122, the memory material 124, the tunnel dielectric material 126, the channel material 128, and the conductive material 132. However, it will be understood that the circles illustrating the pillars 120 in FIG. 1B include the each of the charge blocking material 122, the memory material 124, the tunnel dielectric material 126, the channel material 128, and the conductive material 132 depicted in FIG. 1A and within the cross-section of FIG. 1B.

With returned reference to FIG. 1A, in some embodiments, the pillars 120 include a barrier material horizontally intervening between the charge blocking material 122 and the levels of the insulative structures 104 and additional insulative structures 106. In some such embodiments, the barrier material may be formed of and include one or more of a metal oxide (e.g., one or more of aluminum oxide, hafnium oxide, zirconium oxide, lanthanum oxide, yttrium oxide, tantalum oxide, gadolinium oxide, niobium oxide, titanium oxide), a dielectric silicide (e.g., aluminum silicide, hafnium silicate, zirconium silicate, lanthanum silicide, yttrium silicide, tantalum silicide), and a dielectric nitride (e.g., aluminum nitride, hafnium nitride, lanthanum nitride, yttrium nitride, tantalum nitride). In some embodiments, the barrier material comprises aluminum oxide.

The charge blocking material 122 may be formed of and include a dielectric material such as, for example, one or more of an oxide (e.g., silicon dioxide), a nitride (silicon nitride), and an oxynitride (silicon oxynitride), or another material. In some embodiments, the charge blocking material 122 comprises silicon oxynitride.

The memory material 124 may comprise a charge trapping material or a conductive material. The memory material 124 may be formed of and include one or more of silicon nitride, silicon oxynitride, polysilicon (doped polysilicon), a conductive material (tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material polycrystalline or amorphous semiconductor material including at least one elemental semiconductor element or at least one compound semiconductor material, conductive nanoparticles (e.g., ruthenium nanoparticles), metal dots. In some embodiments, the memory material 124 comprises silicon nitride.

The tunnel dielectric material 126 may be formed of and include a dielectric material through which charge tunneling can be performed under suitable electrical bias conditions, such as through hot-carrier injection or by Fowler-Nordheim tunneling induced charge transfer. By way of non-limiting example, the tunnel dielectric material 126 may be formed of and include one or more of silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In some embodiments, the tunnel dielectric material 126 comprises silicon dioxide. In other embodiments, the tunnel dielectric material 126 comprises nitrogen, such as an oxynitride. In some such embodiments, the tunnel dielectric material 126 comprises silicon oxynitride.

In some embodiments the tunnel dielectric material 126, the memory material 124, and the charge blocking material 122 together may comprise a structure configured to trap a charge, such as, for example, an oxide-nitride-oxide (ONO) structure. In some such embodiments, the tunnel dielectric material 126 comprises silicon dioxide, the memory material 124 comprises silicon nitride, and the charge blocking material 122 comprises silicon dioxide. In other embodiments, the tunnel dielectric material 126, the memory material 124, and the charge blocking material 122 together comprise an oxide-nitride-oxynitride structure. In some such embodiments, the tunnel dielectric material 126 comprises silicon oxynitride, the memory material 124 comprises silicon nitride, and the charge blocking material 122 comprises silicon dioxide.

The channel material 128 may be formed of and include one or more of a semiconductor material (at least one elemental semiconductor material, such as polycrystalline silicon; at least one III-V compound semiconductor material, at least one II-VI compound semiconductor material, at least one organic semiconductor material, GaAs, InP, GaP, GaN, other semiconductor materials), and an oxide semiconductor material. In some embodiments, the channel material 128 includes amorphous silicon or polysilicon. In some embodiments, the channel material 128 comprises a doped semiconductor material.

The insulative material 130 may be formed of and include an insulative material such as, for example, phosphosilicate glass (PSG), borosilicate glass (BSG), fluorosilicate glass (FSG), borophosphosilicate glass (BPSG), silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), a dielectric carbon nitride material (e.g., silicon carbon nitride (SiCN)), a dielectric carboxynitride material (e.g., silicon carboxynitride (SiOCN)), or combinations thereof. In some embodiments, the insulative material 130 comprises silicon dioxide.

With continued reference to FIG. 1A, a conductive contact structure 135 may be formed in electrical communication with the channel material 128 of the pillars 120. For example, in some embodiments, a portion of the insulative material 130 within the pillars 120 may be selectively removed to form a recessed portion in each of the pillars 120. After selectively removing the insulative material 130, a conductive material 132 may be formed within the recess of each pillar 120 and in electrical communication with the channel material 128. The conductive material 132 may be formed of and include, for example, tungsten. In other embodiments, the conductive material 132 comprises polysilicon.

The conductive contact structure 135 may be in electrical communication with, for example, a conductive line (e.g., a bit line) for providing access to strings (e.g., strings 172 (FIG. 1H)) of memory cells (e.g., memory cells 174 (FIG. 1I)) formed from the pillars 120.

An additional dielectric material 134 may vertically (e.g., in the Z-direction) overlie the stack structure 102 and the pillars 120. The additional dielectric material 134 may be formed of and include insulative material. In some embodiments, the additional dielectric material 134 comprises the same material composition as the insulative structures 104. In some embodiments, the additional dielectric material 134 comprises silicon dioxide.

An etch stop material 136 may vertically (e.g., in the Z-direction) overlie the additional dielectric material 134. The etch stop material 136 may exhibit an etch selectivity with respect to the additional dielectric material 134 and a dielectric material 138 vertically overlying the etch stop material 136 and the staircase region 115. The dielectric material 138 may be formed of and include one or more of the materials described above with reference to the dielectric material 118. In some embodiments, the dielectric material 138 comprises silicon dioxide.

The etch stop material 136 may be formed of and include a dielectric carbon nitride material (e.g., silicon carbon nitride (SiCN)), a dielectric carboxynitride material (e.g., silicon carboxynitride (SiOCN)). In some embodiments, the etch stop material 136 comprises carbon-doped silicon nitride.

A thickness (e.g., in the Z-direction) of the etch stop material 136 may be within a range from about 150 Angstroms (Å) to about 350 Å, such as from about 150 Å to about 250 Å, or from about 250 Å to about 350 Å. In some embodiments, the thickness of the etch stop material 136 is about 250 Å.

Figure 1C:
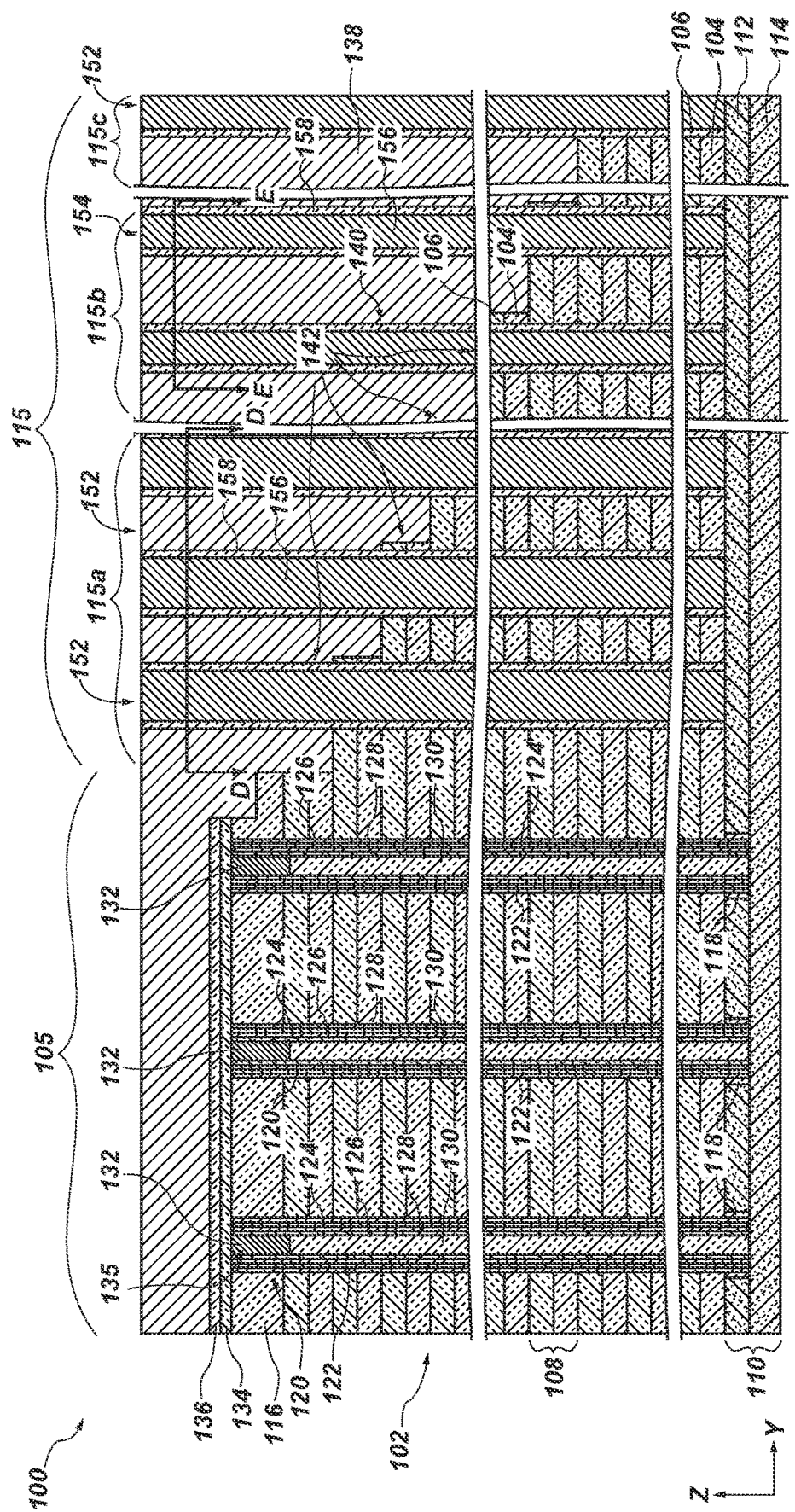
Figure 1D:
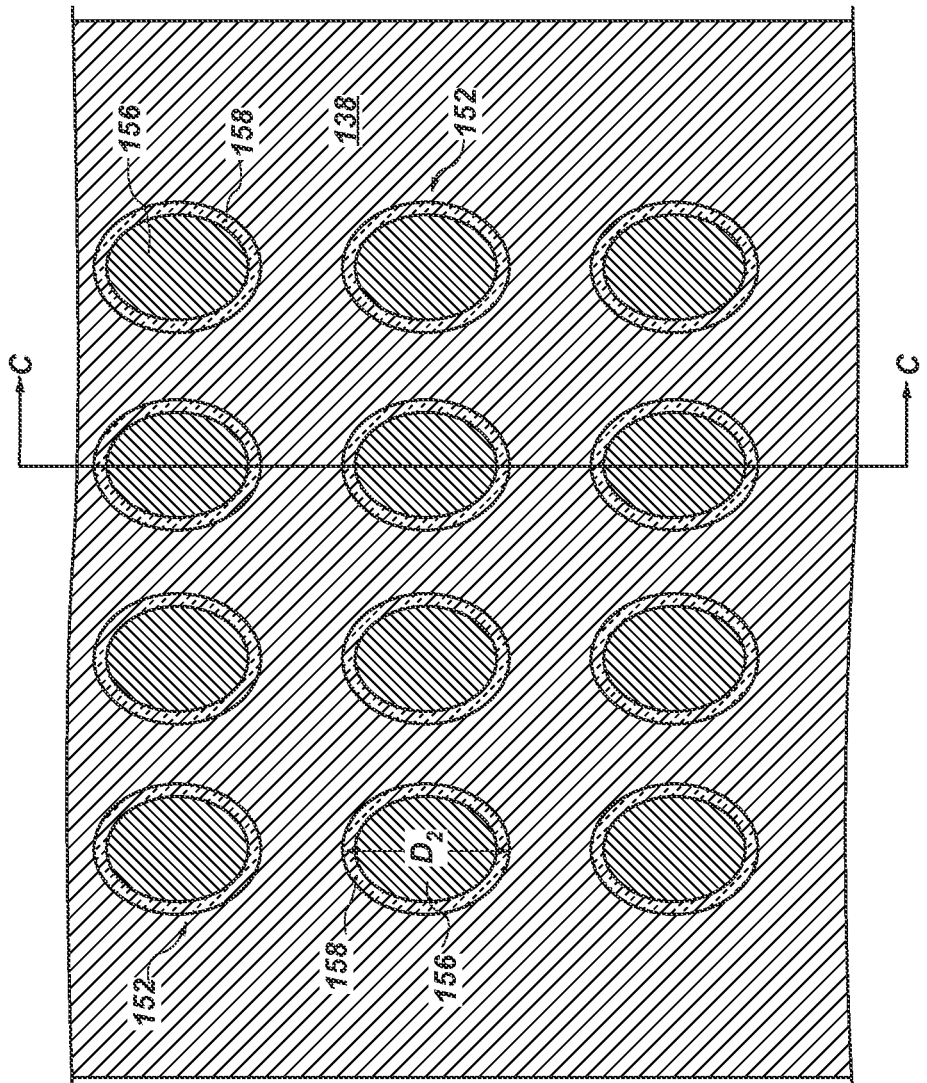
Figure 1E:
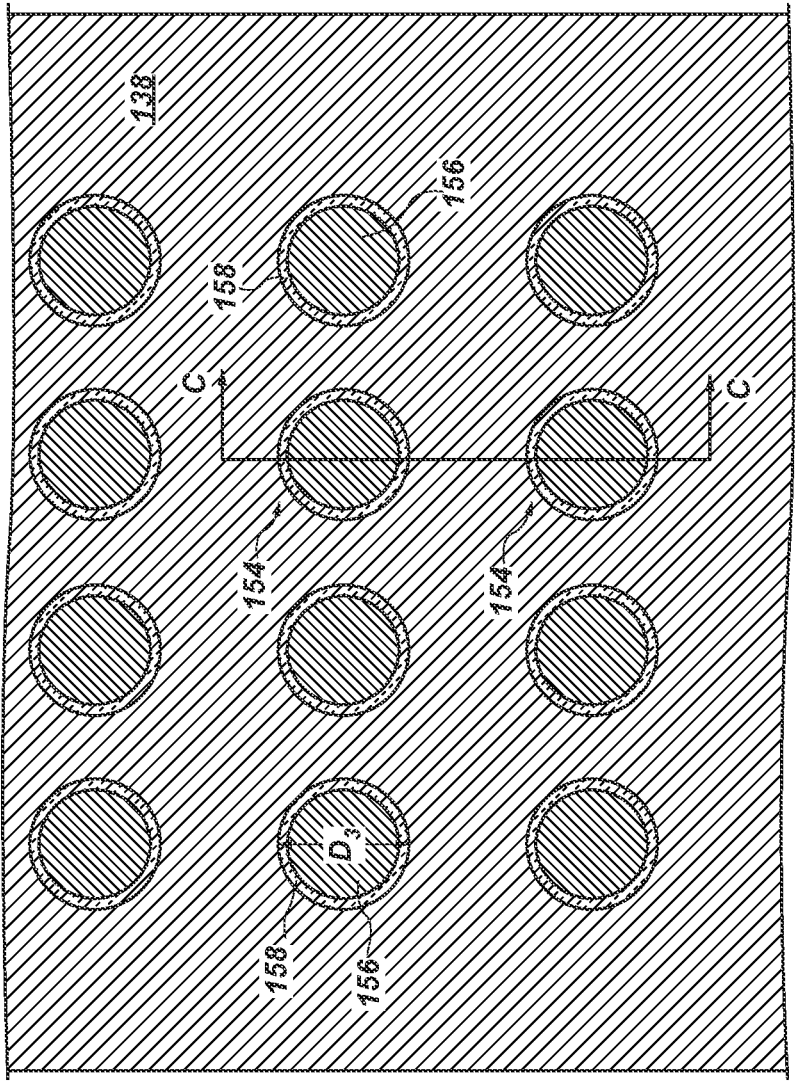

With reference to FIG. 1C through FIG. 1E, first support pillar structures 152 and second support pillar structures 154 may be formed within the distributed staircase region 115, such as within the first staircase region 115a, the second staircase region 115b, and the third staircase region 115c. For example, the first support pillar structures 152 may be formed to vertically (e.g., in the Z-direction) extend through the stack structure 102 in the first staircase region 115a and the third staircase region 115c and second support pillar structures 154 may be formed to vertically extend through the stack structure 102 in the second staircase region 115b. The first support pillar structures 152 and the second support pillar structures 154 may collectively be referred to herein as "support pillar structures." FIG. 1D is a simplified partial top-down view of the first staircase region 115a of the microelectronic device structure 100 of FIG. 1C and FIG. 1E is a simplified partial top-down view of the second staircase region 115b of the microelectronic device structure 100 of FIG. 1C.

The first support pillar structures 152 may have a lateral dimension (e.g., diameter) $D_2$ (FIG. 1D) that is larger than a lateral dimension (e.g., diameter) $D_3$ (FIG. 1E) of the second support pillar structures 154. In some embodiments, the first support pillar structures 152 exhibit a larger cross-sectional area than the second support pillar structures 154.

The lateral dimension $D_2$ of the first support pillar structures 152 may be within a range from about 200 nm to about 600 nm, such as from about 200 nm to about 300 nm, from about 300 nm to about 400 nm, from about 400 nm to about 500 nm, or from about 500 nm to about 600 nm. In some embodiments, the lateral dimension $D_2$ is greater than about 200 nm, such as greater than about 400 nm, or greater than about 600 nm.

The lateral dimension $D_3$ of the second support pillar structures 154 may be within a range from about 150 nm to about 400 nm, such as from about 150 nm to about 200 nm, from about 200 nm to about 300 nm, or from about 300 nm to about 400 nm.

The first support pillar structures 152 and the second support pillar structures 154 may each individually comprise a first material 156 vertically (e.g., in the Z-direction) extending through the stack structure 102 and to the source tier 110 and a liner material 158 on sidewalls of the first material 156. The liner material 158 may substantially surround (e.g., substantially horizontally and vertically cover) sidewalls of the first material 156.

The first material 156 may be formed of and include at least one conductive material, such as such as one or more of a metal (e.g., W, Ti, Mo, Nb, V, Hf, Ta, Cr, Zr, Fe, Ru, Os, Co, Rh, Ir, Ni, Pd, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). In some embodiments, the first material 156 of each of the support pillar structures 152, 154 has substantially the same material composition.

In other embodiments, the first material 156 is formed of and includes an insulative material. In some such embodiments, the first material 156 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the first material 156 comprise $SiO_2$. In some embodiments, such as where the first material 156 comprises an insulative material, the support pillar structures 152, 154 may not include the liner material 158 on sidewalls of the first material 156 and the support pillar structures 152, 154 may comprise only the first material 156 (e.g., the insulative material).

The liner material 158 may be horizontally interposed between each of the first materials 156 of the support pillar structures 152, 154 and the tiers 108 (including the insulative structures 104 and the additional insulative structures 106 thereof) of the stack structure 102. The liner material 158 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the liner material 158 comprises $SiO_2$. In some embodiments, the liner material 158 has a different material composition than the dielectric material 138. In other embodiments, the liner material 158 has the same material composition as the dielectric material 138. In some embodiments, the liner material 158 comprises a material composition that is not substantially removed responsive to exposure to etch chemistries formulated and configured to remove silicon nitride.

The support pillar structures 152, 154 may each individually exhibit a desired geometric configuration (e.g., dimensions and shape) and spacing. The geometric configurations and spacing of the support pillar structures 152, 154 may be selected at least partially based on the configurations and positions of other components (e.g., the steps 142 of the staircase structure 140, first conductive contact structures 150 (FIG. 1K) to be formed in contact with the steps 142 of the staircase structure 140 of the first staircase region 115a and the third staircase region 115c, second conductive contact structures 175 (FIG. 1N) to be formed in contact with the steps 142 of the staircase structure 140 of the second staircase region 115b, the source tier 110) of the microelectronic device structure 100. For example, the support pillar structures 152, 154 may each individually have a geometric configuration and spacing permitting the support pillar structure 152, 154 to vertically-extend (e.g., in the Z-direction) through the stack structure 102 and physically contact (e.g., land on) a structure of the source tier 110 to facilitate a predetermined function (e.g., an electrical interconnection function, a support function) of the support pillar structure 152, 154. In other embodiments, the support pillar structures 152, 154 do not include an electrical interconnection function and serve primarily (e.g., only) a support function.

Each of the first support pillar structures 152 may exhibit substantially the same geometric configuration (e.g., the same dimensions and the same shape) and horizontal spacing (e.g., in the X-direction) as each of the other first support pillar structures 152, or at least some of the first support pillar structures 152 may exhibit a different geometric configuration (e.g., one or more different dimensions, a different shape) and/or different horizontal spacing than at least some other of the first support pillar structures 152. In some embodiments, the first support pillar structures 152 are at least partially uniformly spaced in the X-direction and in the Y-direction. In some embodiments, the first support pillar structures 152 are arranged in rows extending in the X-direction and in columns extending in the Y-direction. In other embodiments, the first support pillar structures 152 are at least partially non-uniformly spaced in the X-direction.

In some embodiments, the first support pillar structures 152 exhibit an elliptical cross-sectional shape. For example, in some embodiments, the first support pillar structures 152 exhibit an oval shape and are elongated in one lateral direction (e.g., the Y-direction).

Each of the second support pillar structures 154 may exhibit substantially the same geometric configuration (e.g., the same dimensions and the same shape) and horizontal spacing (e.g., in the X-direction) as each of the other second support pillar structures 154, or at least some of the second support pillar structures 154 may exhibit a different geometric configuration (e.g., one or more different dimensions, a different shape) and/or different horizontal spacing than at least some other of the second support pillar structures 154. In some embodiments, the second support pillar structures 154 are at least partially uniformly spaced in the X-direction and in the Y-direction. In some embodiments, the second support pillar structures 154 are arranged in rows extending in the X-direction and in columns extending in the Y-direction. In other embodiments, the second support pillar structures 154 are at least partially non-uniformly spaced in the X-direction.

In some embodiments, the second support pillar structures 154 exhibit a substantially circular lateral cross-sectional shape. In some embodiments, the second support pillar structures 154 exhibit a different lateral cross-sectional shape than the first support pillar structures 152. In some embodiments, the first support pillar structures 152 exhibit a lateral dimension (e.g., a length, a diameter) that is larger than a dimension (e.g., a length, a diameter) of the second support pillar structures 154.

The support pillar structures 152, 154 may serve as support structures during and/or after the formation of one or more components of the microelectronic device structure 100. For example, the support pillar structures 152, 154 may serve as support structures for the formation of conductive structures (e.g., conductive structures 162 (FIG. 1F)) during replacement of the additional insulative structures 106 with the conductive structures, as will be described herein. The support pillar structures 152, 154 may impede (e.g., prevent) tier collapse during the selective removal of the additional insulative structures 106.

Figure 1F:
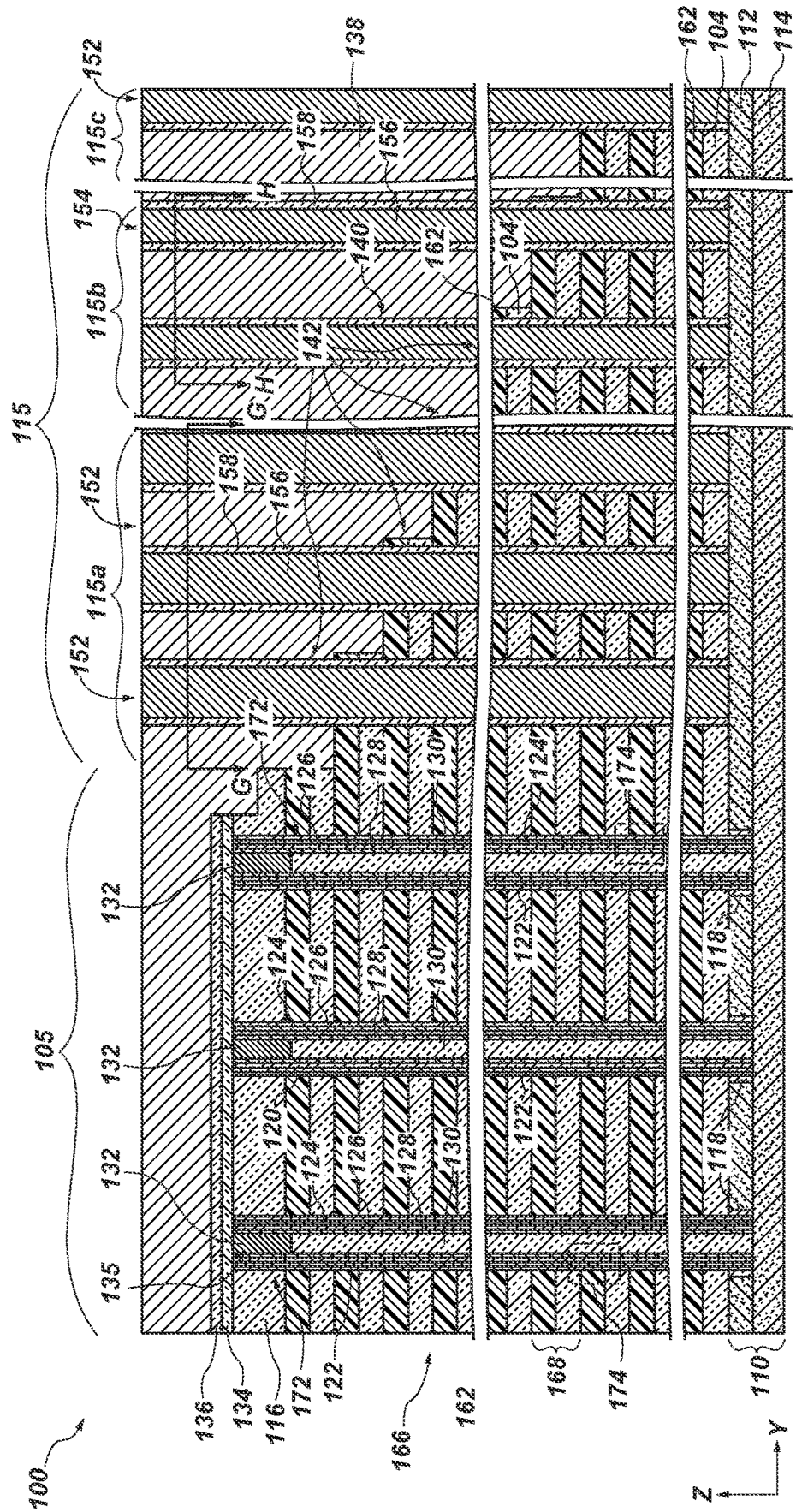
Figure 1G:
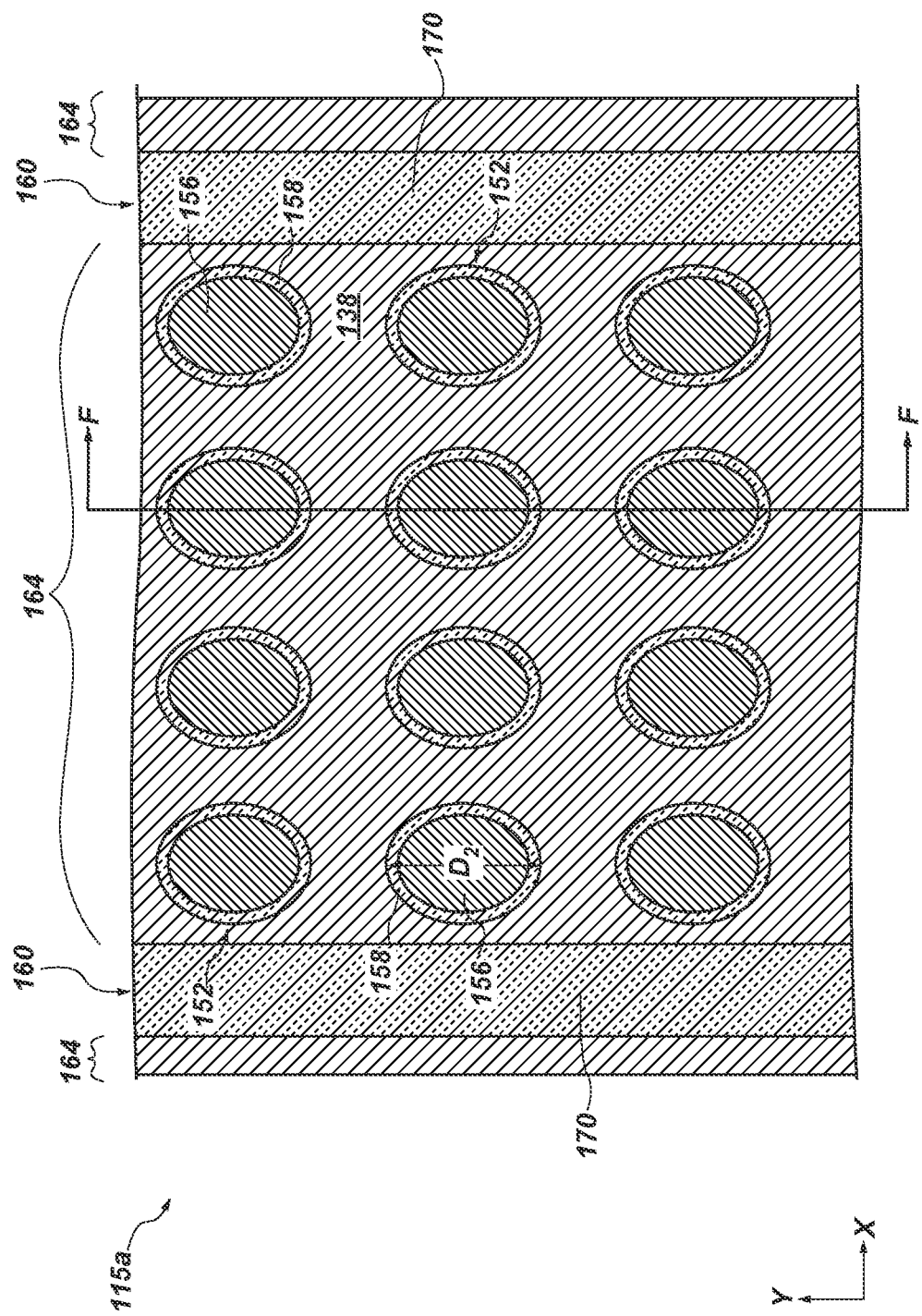
Figure 1H:
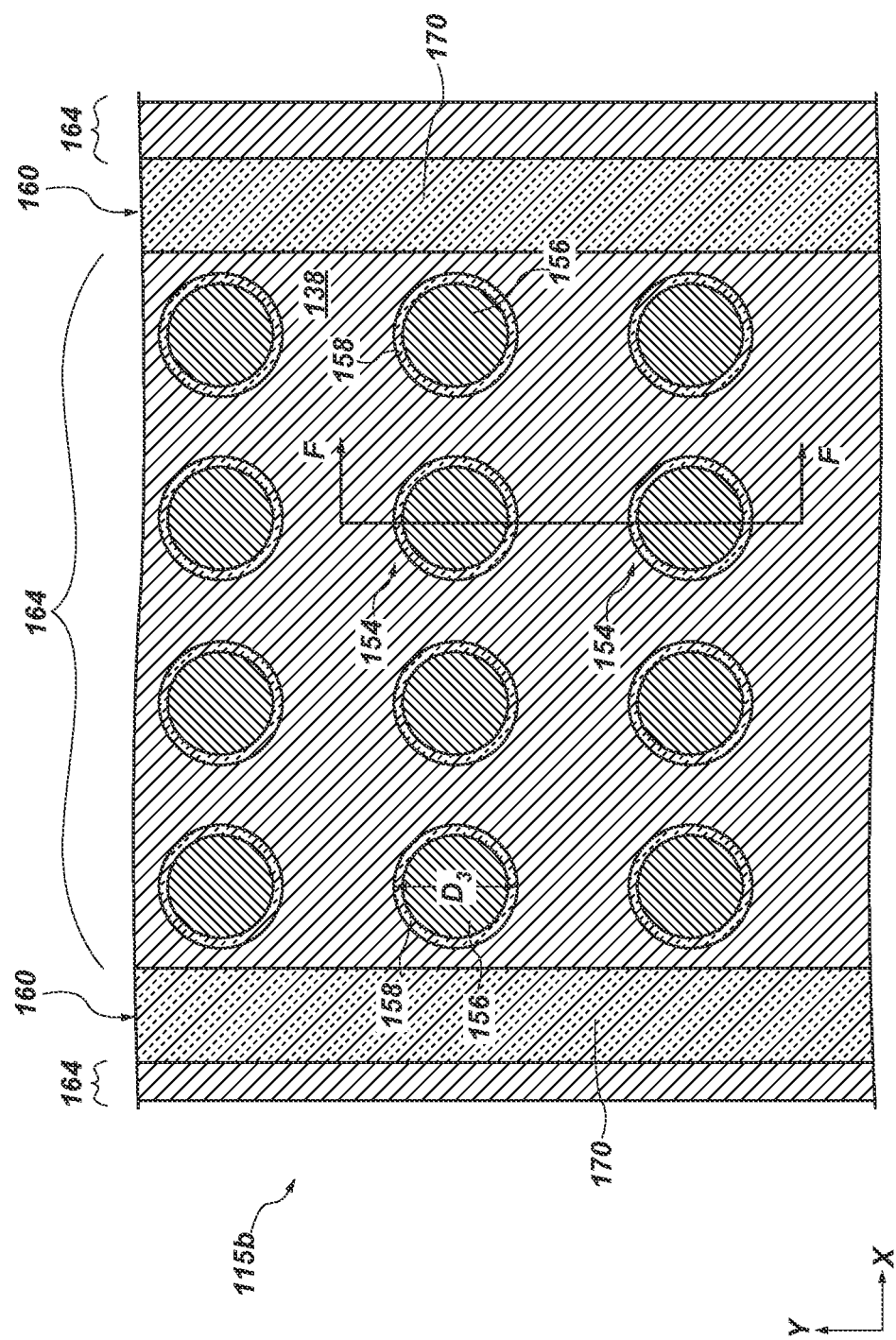

Referring collectively to FIG. 1F through FIG. 1H, after forming the first support pillar structures 152 and the second support pillar structures 154, slot structures 160 (FIG. 1G, FIG. 1H) may be formed through the stack structure 102. The slot structures 160 may be formed within slots (e.g., openings, apertures) formed through the stack structure 102 to facilitate replacement of the additional insulative structures 106 (FIG. 1C) with conductive structures 162 (FIG. 1F) through so-called "replacement gate" or "gate last" processing acts. The slot structures 160 may be horizontally interposed between block structures 164 (FIG. 1G, FIG. 1H) formed by partitioning the stack structure 102 with the slots for the replacement gate process. In other words, the slot structures 160 may separate the microelectronic device structure 100 into block structures 164. FIG. 1G is a simplified partial top-down view of a portion of the first staircase region 115a taken through section line G-G of FIG. 1F and FIG. 1H is a simplified partial top-down view of a portion of the second staircase region 115b taken through section line H-H of FIG. 1F.

In some embodiments, each block structure 164 includes four (4) columns of the either the first support pillar structures 152 or the second support pillar structures 154 located between horizontally neighboring slot structures 160. However, the disclosure is not so limited and, in other embodiments, each block structure 164 may include fewer (e.g., three, two, one) columns of the first support pillar structures 152 and the second support pillar structures 154; or each block structure 164 may include more (e.g., five, six, seven, eight) columns of the first support pillar structures 152 and the second support pillar structures 154.

Slots (also referred to herein as "replacement gate slots") may be formed through the stack structure 102 at locations corresponding to the slot structures 160 to extend through the dielectric material 138, the additional dielectric material 134, the etch stop material 136, the dielectric material 116, and the tiers 108 of the insulative structures 104 and the additional insulative structures 106 (FIG. 1C). In some embodiments, the slots may expose the source tier 110, such as the first source material 112.

The additional insulative structures 106 (FIG. 1C) may be selectively removed (e.g., exhumed) through the slots. Spaces between vertically neighboring (e.g., in the Z-direction) insulative structures 104 may be filled with a conductive material to form the conductive structures 162 and a stack structure 166 including tiers 168 of the insulative structures 104 and the conductive structures 162. The conductive structures 162 may be located at locations corresponding to the locations of the additional insulative structures 106 removed through the slots.

After forming the conductive structures 162, the slots may be filled with one or more materials to form the slot structures 160. In some embodiments, the slot structures 160 include an insulative material 170. The insulative material 170 may include one or more of the materials described above with reference to the insulative structures 104. In some embodiments, the insulative material 170 comprises silicon dioxide. In other embodiments, the slot structures 160 include, for example, a liner material on sidewalls thereof and a conductive material horizontally neighboring the liner material. In some such embodiments, the liner material may comprise an insulative material, such as, for example, silicon dioxide; and the conductive material may include polysilicon or tungsten and may be in electrical communication with the source tier 110 (e.g., such as through the first source material 112).

Although FIG. 1G and FIG. 1H illustrate only two slot structures 160 and only three block structures 164, the disclosure is not so limited. The microelectronic device structure 100 may include a plurality of (e.g., four, five, six, eight) block structures 164, each separated from laterally neighboring (e.g., in the Y-direction) block structures 164 by a slot structure 160. In other words, the slot structures 160 may divide the microelectronic device structure 100 into any desired number of block structures 164.

The conductive structures 162 may be formed of and include at least one conductive material, such as at least one metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), at least one conductively-doped semiconductor material (e.g., conductively-doped polysilicon, conductively-doped germanium (Ge), conductively-doped silicon germanium (SiGe)), at least one conductive metal-containing material (e.g., a conductive metal nitride, a conductive metal silicide, a conductive metal carbide, a conductive metal oxide), or combinations thereof. In some embodiments, the conductive structures 162 are formed of and include tungsten.

Each of the conductive structures 162 may individually include a substantially homogeneous distribution of the at least one conductive material, or a substantially heterogeneous distribution of the at least one conductive material. In some embodiments, each of the conductive structures 162 of each of the tiers 168 of the stack structure 166 exhibits a substantially homogeneous distribution of conductive material. In additional embodiments, at least one of the conductive structures 162 of at least one of the tiers 168 of the stack structure 166 exhibits a substantially heterogeneous distribution of at least one conductive material. The conductive structure 162 may, for example, be formed of and include a stack of at least two different conductive materials. The conductive structures 162 of each of the tiers 168 of the stack structure 166 may each be substantially planar, and may each exhibit a desired thickness.

In some embodiments, the conductive structures 162 may include a conductive liner material around the conductive structures 162 such as between the conductive structures 162 and the insulative structures 104. The conductive liner material may comprise, for example, a seed material from which the conductive structures 162 may be formed. The conductive liner material may be formed of and include, for example, a metal (e.g., titanium, tantalum), a metal nitride (e.g., tungsten nitride, titanium nitride, tantalum nitride), or another material. In some embodiments, the conductive liner material comprises titanium nitride.

At least one lower conductive structure 162 of the stack structure 166 may be employed as at least one lower select gate (e.g., at least one source side select gate (SGS)) of the microelectronic device structure 100. In some embodiments, a single (e.g., only one) conductive structure 162 of a vertically lowermost tier 168 of the stack structure 166 is employed as a lower select gate (e.g., a SGS) of the microelectronic device structure 100. In addition, upper conductive structure(s) 162 of the stack structure 166 may be employed as upper select gate(s) (e.g., drain side select gate(s) (SGDs)) of the microelectronic device structure 100. In some embodiments, horizontally-neighboring conductive structures 162 of a vertically uppermost tier 168 of the stack structure 166 (e.g., separated from each other by additional slot structures) are employed as upper select gates (e.g., SGDs) of the microelectronic device structure 100. In some embodiments, more than one (e.g., two, four, five, six) conductive structures 162 are employed as an upper select gate (e.g., a SGD) of the microelectronic device structure.

With continued reference to FIG. 1F, formation of the conductive structures 162 may form strings 172 of memory cells 174, each memory cell 174 located at an intersection of a conductive structure 162 and the memory cell materials (e.g., the charge blocking material 122, the memory material 124, the tunnel dielectric material 126) and the channel material 128. Each block structure 164 may include a plurality of the strings 172 of memory cells 174. As will be described herein, each block structure 164 may include a staircase structure (e.g., staircase structure 140, staircase structure 220 (FIG. 2)) laterally offset (e.g., in the X-direction) from the strings 172 of the memory cells 174. The strings 172 of memory cells 174 may be located within horizontal boundaries of the conductive structures 162 of the tiers 168. The strings 172 may be located within the horizontal boundaries of the array region 105.

Although the microelectronic device structure 100 has been described and illustrated as comprising memory cells 174 having a particular configuration, the disclosure is not so limited. In some embodiments, the memory cells 174 may comprise so-called "MONOS" (metal-oxide-nitride-oxide-semiconductor) memory cells. In additional embodiments, the memory cells 174 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In other embodiments, the memory cells 174 comprise so-called "floating gate" memory cells including floating gates (e.g., metallic floating gates) as charge storage structures. The floating gates may horizontally intervene between central structures of the strings 172 and the conductive structures 162.

Figure 1I:
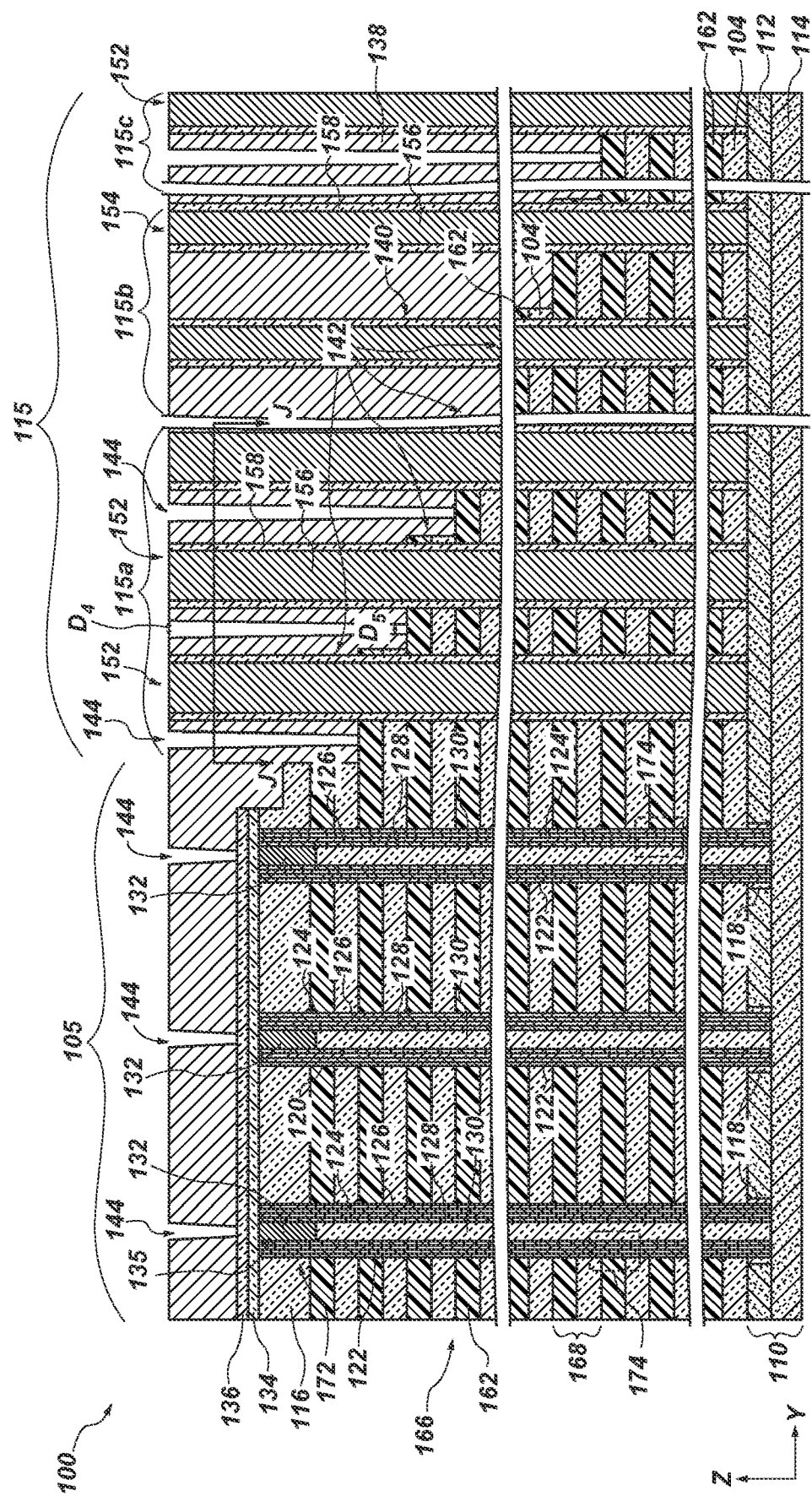
Figure 1J:
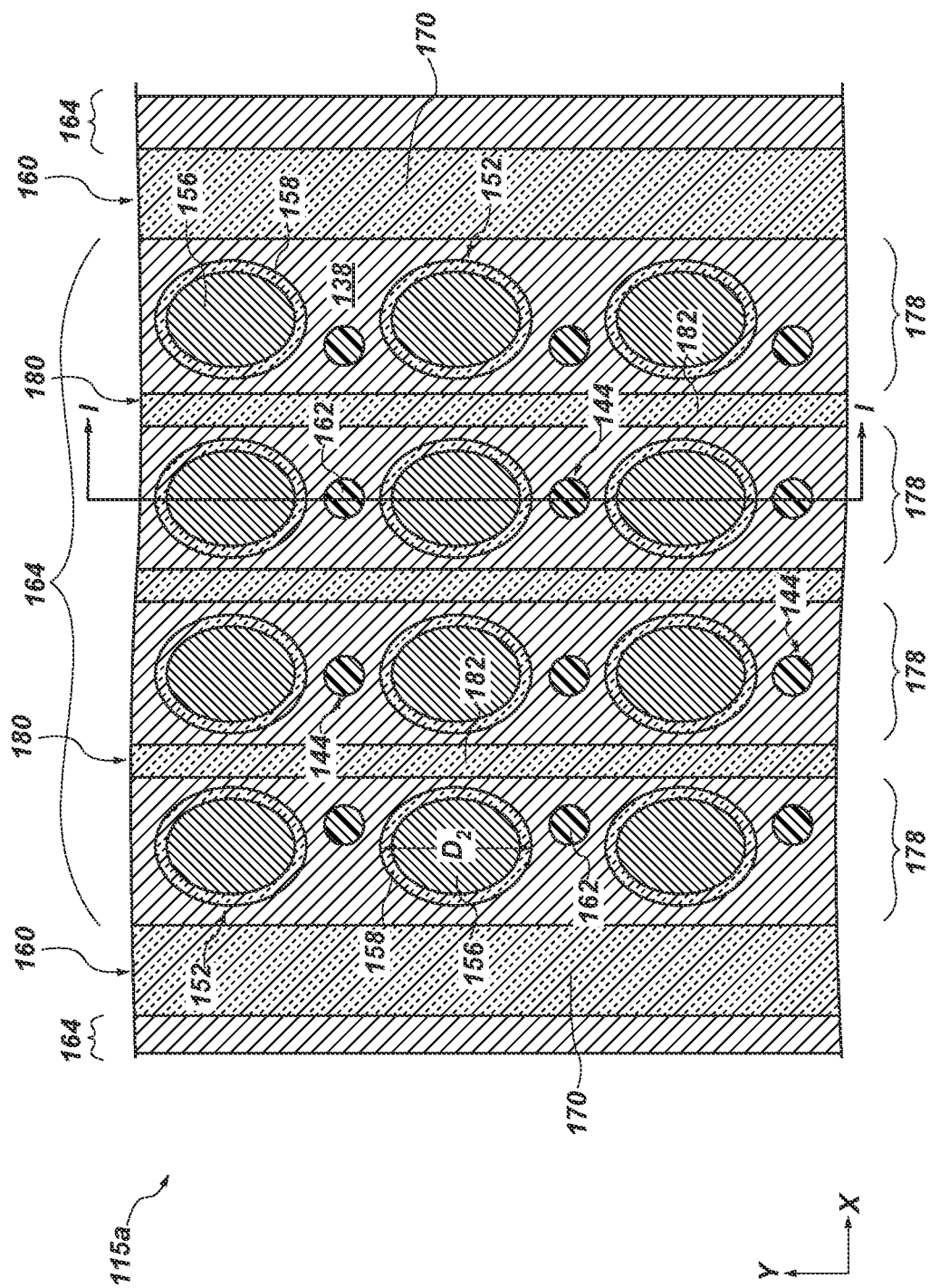

Referring collectively to FIG. 1I and FIG. 1J, after forming the slot structures 160, the block structures 164 may be divided into sub-block structures 178 (FIG. 1J) within the array region 105, the first staircase region 115a, and the third staircase region 115c by additional slot structures 180 (FIG. 1J). FIG. 1J is a simplified partial top-down view of a portion of the first staircase region 115a of the microelectronic device structure 100 of FIG. 1I taken through section line J-J of FIG. 1I. Each of the sub-block structures 178 may be defined within lateral boundaries of an individual block structure 164. In some embodiments, the additional slot structures 180 define four (4) sub-block structures 178 located within the lateral boundaries of an individual block structure 164. It will be understood that in some embodiments, the third staircase region 115c may be divided into sub-block structures 178, as described with reference to the first staircase region 115a.

The additional slot structures 180 may vertically (e.g., in the Z-direction) extend through a portion (e.g., a vertically upper portion) of the stack structure 166 (FIG. 1I) a distance less than a distance that the slot structures 160 vertically extend through the stack structure 166. The additional slot structures 180 may extend in parallel in a lateral direction (e.g., in the Y-direction), and may also extend in parallel with the slot structures 160 in the lateral direction. As used herein, "parallel" means substantially parallel.

The additional slot structures 180 may comprise an insulative material 182, such as one or more of the materials described above with reference to the insulative material 170 of the slot structures 160. In some embodiments, the insulative material 182 comprises the same material composition as the insulative material 170. In some embodiments, the insulative material 182 comprises silicon dioxide.

In some embodiments, the additional slot structures 180 are located within the first staircase region 115a and the third staircase region 115c and are not located within the second staircase region 115b. In some such embodiments, the additional slot structures 180 laterally neighboring first support pillar structures 152 are elongated in a lateral direction (e.g., the Y-direction) in which the additional slot structures 180 extend. The first conductive contact structures 150 may be located between laterally neighboring additional slot structures 180.

With continued reference to FIG. 1I and FIG. 1J, openings 144 may be formed through the dielectric material 138 within the array region 105 and through the dielectric material 138 within the first staircase region 115a and the third staircase region 115c. The openings 144 in the array region 105 may expose a portion of the additional dielectric material 134 and the openings 144 in the first staircase region 115a and the third staircase region 115c may expose a portion of some of the conductive structures 162. In some embodiments, the openings 144 within the array region 105 terminate on or within the etch stop material 136.

In some embodiments, the etch stop material 136 within the array region 105 may act as an etch stop during formation of the openings 144 within the array region 105. For example, the dielectric material 138 may exhibit an etch selectivity within a range from about 20:1 to about 60:1, such as from about 20:1 to about 40:1, or from about 40:1 to about 60:1 with respect to the etch stop material 136. In other words, the dielectric material 138 may be removed from about 20 times to about 60 times faster than of the etch stop material 136. The etch stop material 136 within the array region 105 may facilitate formation of the openings 144 within the first staircase region 115a and the third staircase region 115c to have a greater vertical (e.g., in the Z-direction) height than the openings 144 within the array region 105 without removing portions of the conductive contact structures 135.

Vertically (e.g., in the Z-direction) upper portions of the openings 144 may have a diameter $D_4$ that is larger than a diameter $D_5$ of lower portions of the openings 144. The diameter $D_4$ may be within a range from about 50 nanometers (nm) to about 120 nm, such as from about 50 nm to about 60 nm, from about 60 nm to about 80 nm, from about 80 nm to about 100 nm, or from about 100 nm to about 120 nm. In some embodiments, the diameter $D_4$ is from about 90 nm to about 100 nm. The diameter $D_4$ may be within a range from about 40 nm to about 80 nm, such as from about 40 nm to about 50 nm, from about 50 nm to about 60 nm, from about 60 nm to about 70 nm, or from about 70 nm to about 80 nm. In some embodiments, the diameter $D_5$ is within a range from about 50 nm to about 60 nm. However, the disclosure is not so limited and the diameter $D_4$ and the diameter $D_5$ may be different than those described.

In some embodiments, the openings 144 within the first staircase region 115a and the third staircase region 115c are substantially the same size (e.g., diameter $D_4$, $D_5$) as the openings 144 within the array region 105. In some embodiments, the diameter $D_4$ of the openings 144 within the first staircase region 115a and the third staircase region 115c are substantially the same as the diameter $D_4$ of the openings 144 within the array region 105.

Figure 1K:
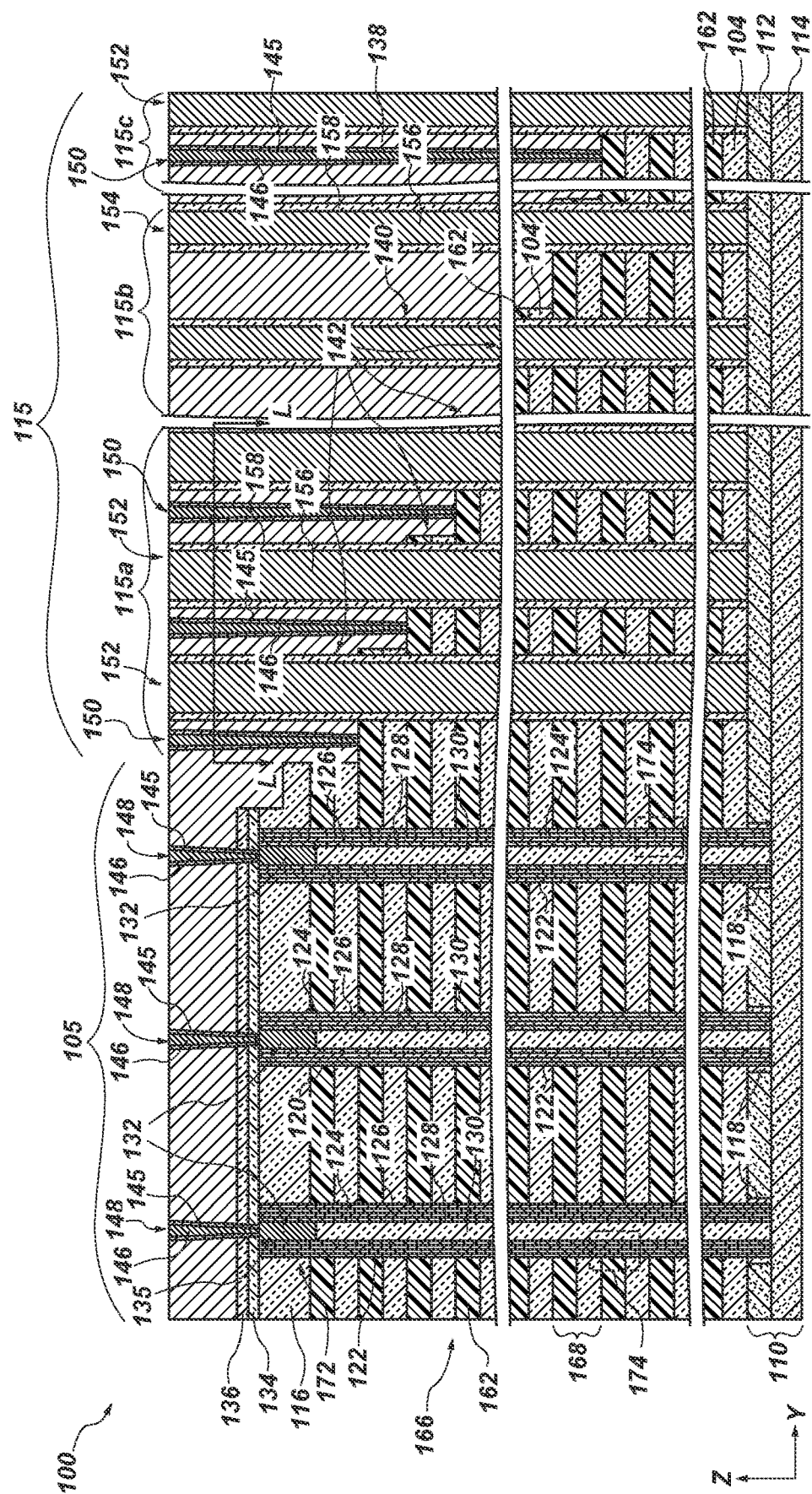
Figure 1L:
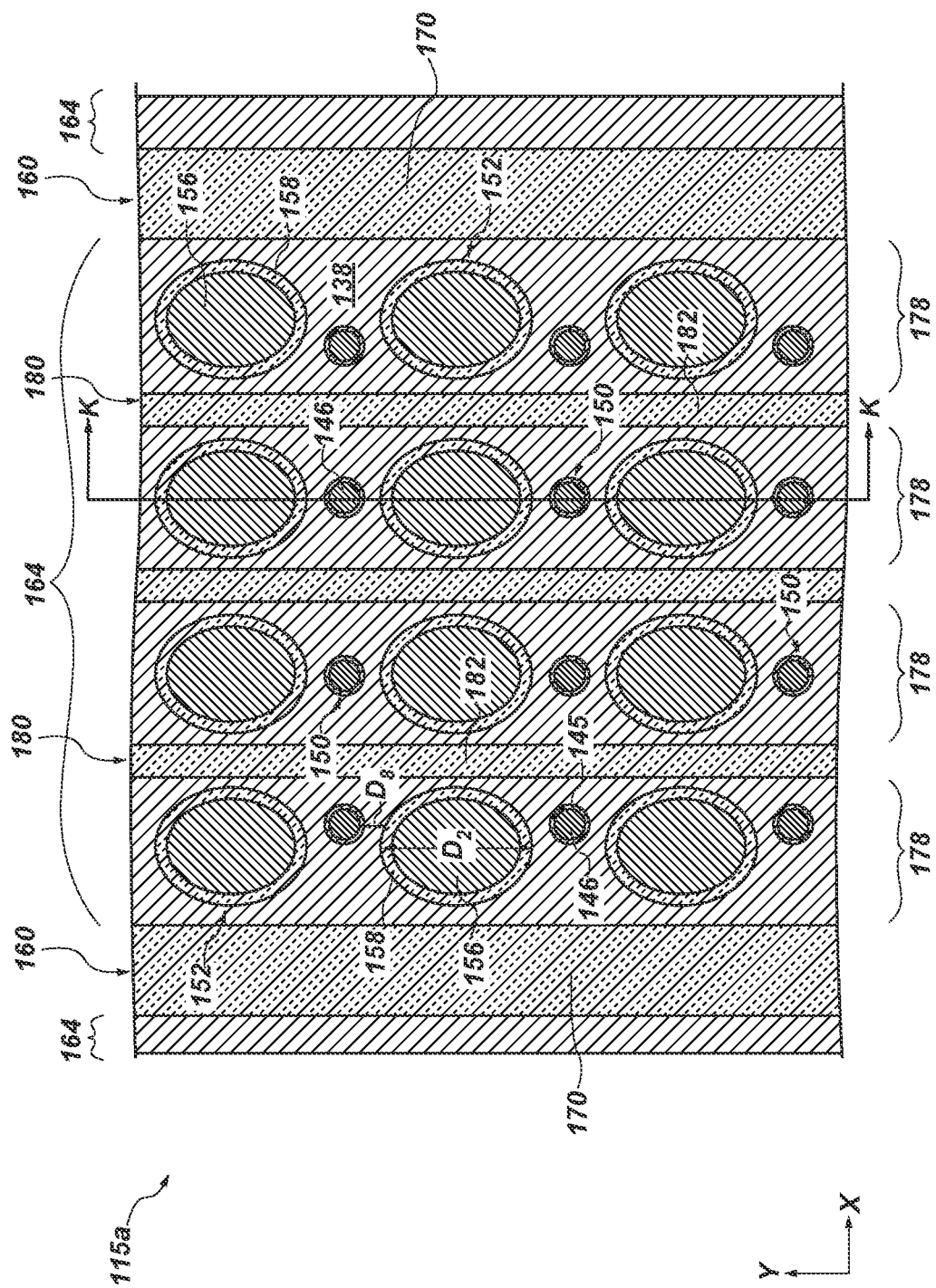
Figure 1M:
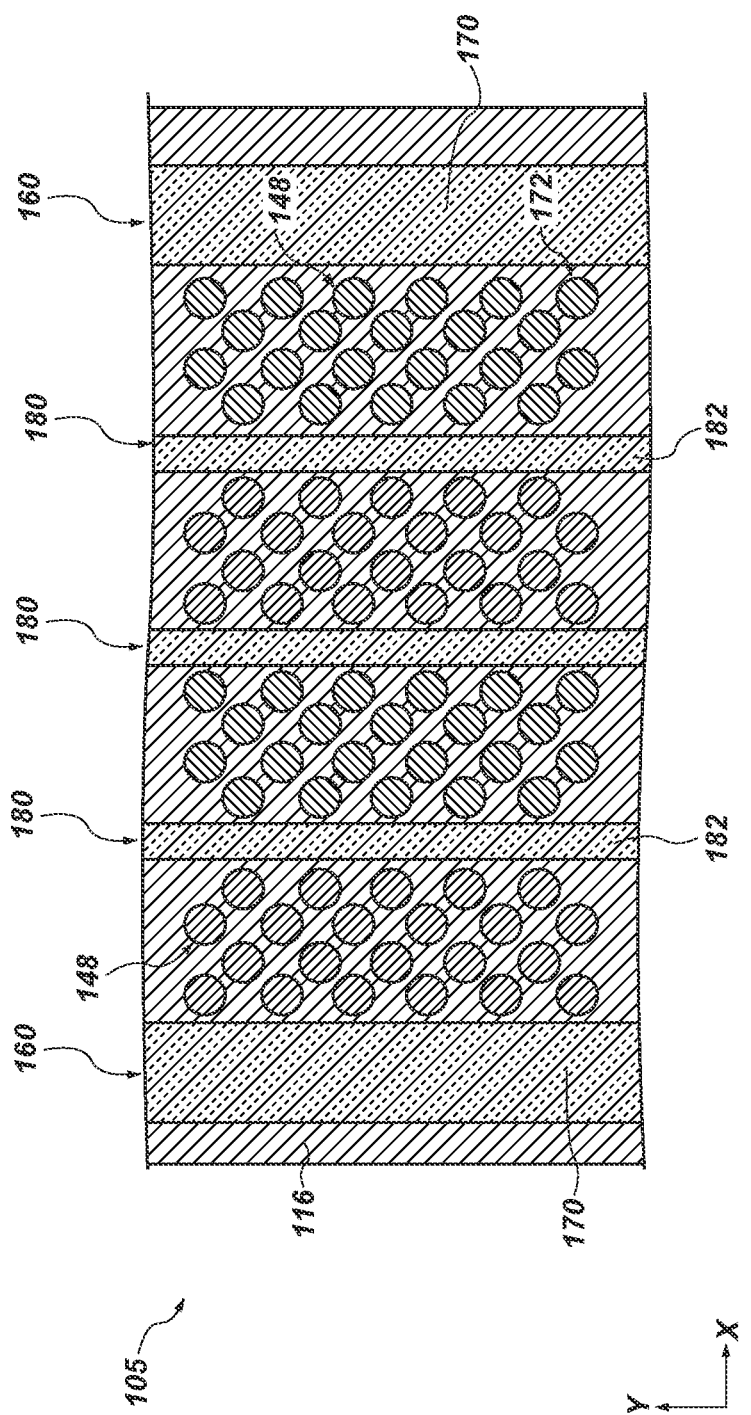

Referring collectively to FIG. 1K through FIG. 1M, the portions of the etch stop material 136 exposed by a group of the openings 144 (FIG. 1I) within the array region 105 may be removed (e.g., punched through) through the openings 144 and portions of the vertically underlying additional dielectric material 134 may be removed through the openings 144 to expose portions of the conductive material 132 of the conductive contact structures 135. FIG. 1L is a simplified partial top-down view of the first staircase region 115a of FIG. 1K taken through section line L-L of FIG. 1K and FIG. 1M is a simplified top-down view of the array region 105 taken through section line M-M of FIG. 1K. Conductive contacts 148 may be formed within the openings 144 in the array region 105 and first conductive contact structures 150 may be formed within openings 144 of the first staircase region 115a and the third staircase region 115c.

A conductive liner material 145 may be formed within the openings 144 (FIG. 1I, FIG. 1J) and a conductive material 146 may be formed over the conductive liner material 145 to form the conductive contacts 148 within the array region 105 and first conductive contact structures 150 within the first staircase region 115a and the third staircase region 115c.

The conductive material 146 of the conductive contacts 148 and the first conductive contact structures 150 may include at least one conductive material, such as one or more of a metal (e.g., W, Ti, Mo, Nb, V, Hf, Ta, Cr, Zr, Fe, Ru, Os, Co, Rh, Ir, Ni, Pd, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). Each of the conductive contacts 148 and the first conductive contact structures 150 may have substantially the same material composition, or at least one of the conductive contacts 148 and the first conductive contact structures 150 may have a different material composition than at least one other of the conductive contacts 148 and the first conductive contact structures 150. In some embodiments, the conductive material 146 comprises tungsten.

The conductive liner material 145 of the conductive contacts 148 and the first conductive contact structures 150 may comprise conductive material, such as one or more of a metal (e.g., titanium, tantalum), a metal nitride (e.g., tungsten nitride, titanium nitride, tantalum nitride), and another material. In some embodiments, the conductive liner material 145 comprises titanium nitride. In some embodiments, the conductive liner material 145 comprises elemental titanium and titanium nitride. By way of non-limiting example, titanium may define external portions of the conductive liner material 145 (e.g., portions of the conductive liner material 145 in contact with the dielectric material 138), and titanium nitride may overlie the titanium and be located between the titanium and the conductive material 146.

Although FIG. 1L illustrates some of the first conductive contact structures 150 (e.g., the first conductive contact structures 150 laterally neighboring the slot structures 160) laterally (e.g., in the X-direction) offset from a center of laterally (e.g., in the Y-direction) neighboring first support pillar structures 152, the disclosure is not so limited. In other embodiments, the first conductive contact structures 150 may be laterally aligned with the first support pillar structures 152.

Figure 1N:
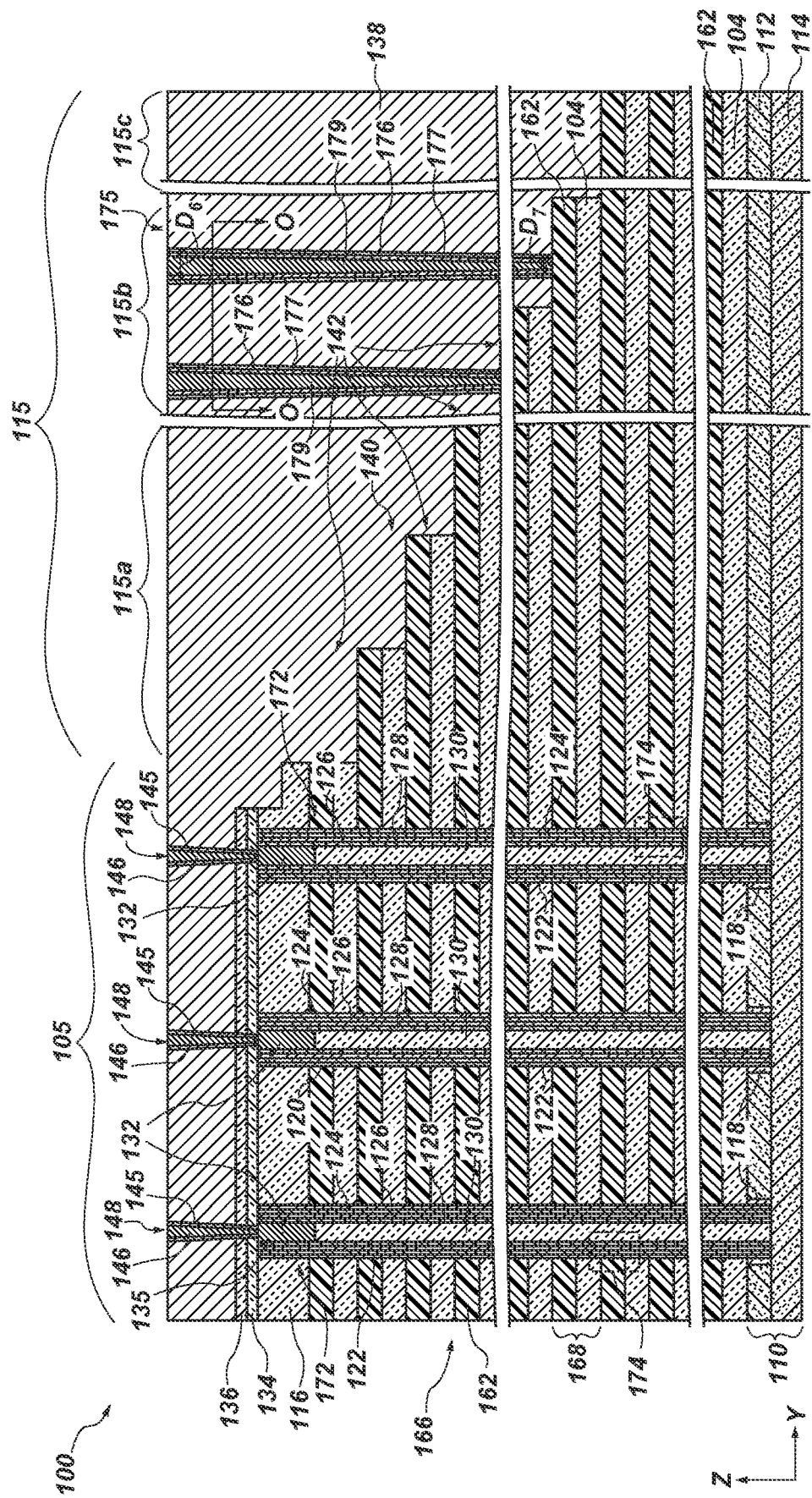
Figure 10:
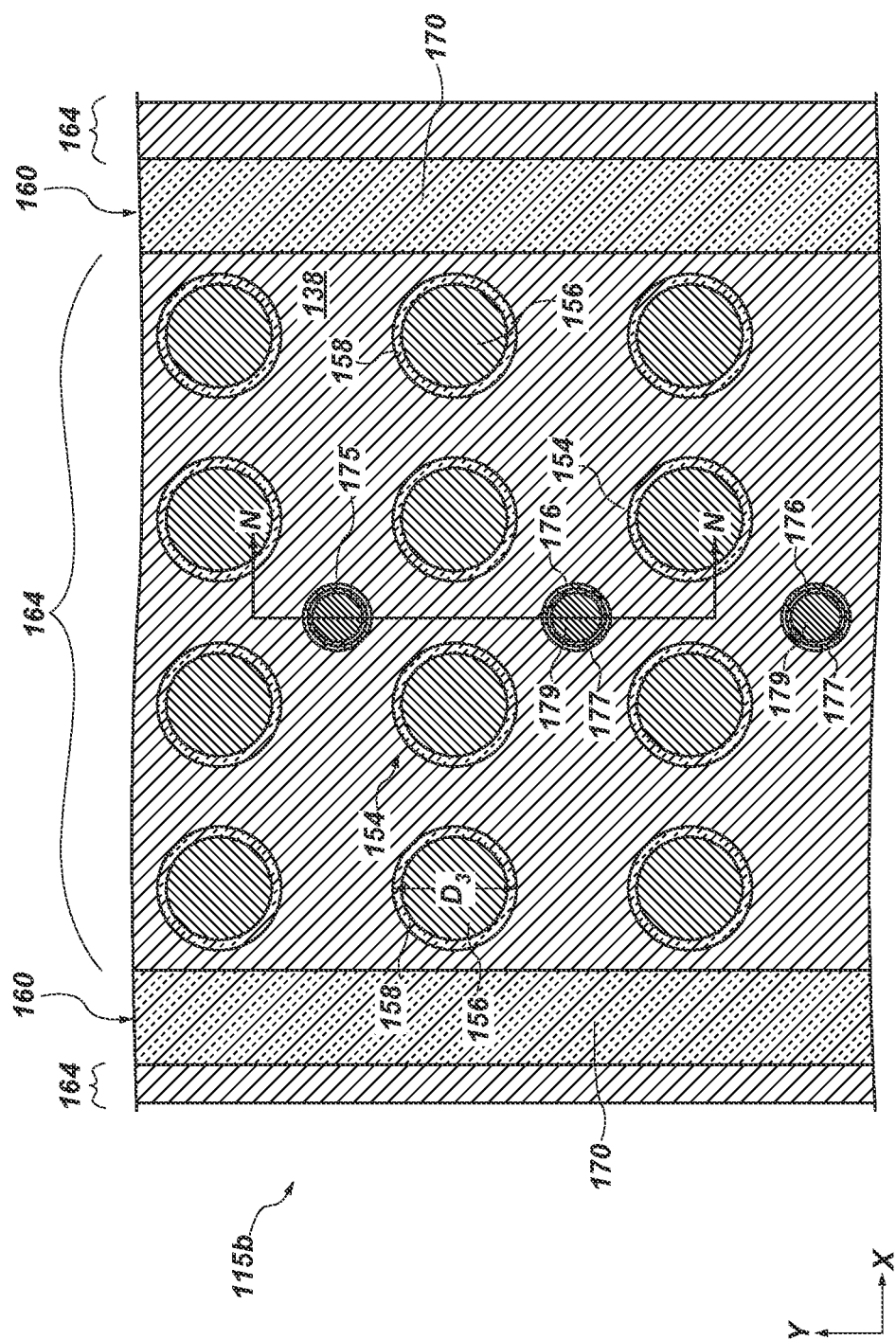

With collective reference to FIG. 1N and FIG. 1O, second conductive contact structures 175 may be formed to vertically extend through the dielectric material 138 and individually contact the conductive structures 162 of the stack structure 166 at the steps 142 of the staircase structures 140 within the second staircase region 115b. The second conductive contact structures 175 may include a dielectric liner material 176 in contact with the dielectric material 138, a conductive liner material 177 in contact with the dielectric liner material 176, and a conductive material 179 in contact with the conductive liner material 177. The dielectric liner material 176 may comprise a dielectric material that may be formed in high aspect ratio (HAR) openings. By way of non-limiting example, the dielectric liner material 176 may include silicon dioxide or a metal oxide (e.g., one or more of aluminum oxide, hafnium oxide, zirconium oxide, lanthanum oxide, yttrium oxide, tantalum oxide, gadolinium oxide, niobium oxide, titanium oxide, magnesium oxide), phosphosilicate glass, borosilicate glass, borophosphosilicate glass, fluorosilicate glass, at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)).

The conductive liner material 177 may comprise one or more of the materials described above with reference to the conductive liner material 145 (FIG. 1K) of the first conductive contact structures 150 (FIG. 1K). In some embodiments, the conductive liner material 177 comprises substantially the same material composition as the conductive liner material 145 of the first conductive contact structures 150. In some embodiments, the conductive liner material 177 comprises titanium and titanium nitride.

The conductive material 179 may include one or more of the materials described above with reference to the conductive material 146 (FIG. 1K) of the first conductive contact structures 150 (FIG. 1K). In some embodiments, the conductive material 179 of the second conductive contact structures 175 comprises substantially the same material composition as the conductive material 146 of the first conductive contact structures 150. In some embodiments, the conductive material 179 comprises tungsten.

A lateral dimension (e.g., diameter) $D_6$ of a vertically (e.g., in the Z-direction) upper portion of each of the second conductive contact structures 175 may be larger than a lateral dimension (e.g., diameter) $D_7$ of a vertically lower portion of each of the second conductive contact structures 175. In some embodiments, the dimension $D_6$ is within a range from about 150 nm to about 300 nm, such as from about 150 nm to about 200 nm, from about 200 nm to about 250 nm, or from about 250 nm to about 300 nm. The dimension $D_7$ may be within a range from about 100 nm to about 200 nm, such as from about 100 nm to about 150 nm, or from about 150 nm to about 200 nm.

Referring collectively to FIG. 1I, FIG. 1L, FIG. 1N, and FIG. 1O, the lateral dimensions $D_6$, $D_7$ of the second conductive contact structures 175 within the second staircase region 115b may be greater than the corresponding lateral dimensions $D_4$, $D_5$ of the first conductive contact structures 150 within the first staircase region 115a and the third staircase region 115c. By way of non-limiting example, in some embodiments, the lateral dimensions $D_4$, $D_5$ of the first conductive contact structures 150 may be less than half the lateral dimensions $D_6$, $D_7$ of the second conductive contact structures 175. In some such embodiments, the second conductive contact structures 175 may each individually have a lateral diameter greater than two times larger than the lateral diameter of each individual first conductive contact structure 150.

The relatively smaller lateral dimensions $D_4$, $D_5$ of the first conductive contact structures 150 may facilitate an increased lateral dimension $D_2$ (FIG. 1L) of the first support pillar structures 152 of the first staircase region 115a relative to the lateral dimension $D_3$ (FIG. 1O) of the second support pillar structures 154 of the second staircase region 115b. The relatively larger lateral dimension $D_2$ of the first support pillar structures 152 of the first staircase region 115a and the third staircase region 115c may facilitate improved support of the insulative structures 104 during the "replacement gate" processing acts described above to replace the additional insulative structures 106 (FIG. 1C) with the conductive structures 162. In other words, the larger lateral dimension $D_2$ of the first support pillar structures 152 may reduce tier collapse of the tiers 108 including the insulative structures 104 during the "replacement gate" processing acts when the additional insulative structures 106 are removed.

With combined reference to FIG. 1L and FIG. 1O, the first staircase region 115a (and the third staircase region 115c) may each individually include four (4) first conductive contact structures 150 on each step 142 (FIG. 1N) for every second conductive contact structure 175 on each corresponding step 142 in the second staircase region 115b. In other words, in some embodiments, the second conductive contact structures 175, the first staircase region 115a may include four (4) first conductive contact structures 150 and the third staircase region 115c may include four (4) first conductive contact structures 150.

Forming the first conductive contact structures 150 simultaneously with formation of the conductive contacts 148 in electrical communication with the channel material 128 may facilitate forming the first conductive contact structures 150 to have a smaller lateral dimension (e.g., diameter) than a corresponding dimension of the second conductive contact structures 175. The smaller lateral dimension of the first conductive contact structures 150 may facilitate an increased margin (e.g., $D_8$ (FIG. 1L)) between the first conductive contacts structures 150 and the first support pillar structures 152. In some embodiments, the first conductive contact structures 150 exhibit a relatively smaller lateral cross-sectional area than the second conductive contact structures 175. The increased margin may facilitate an increased area (e.g., lateral cross-sectional area) for formation of the first support pillar structures 152. Accordingly, the first support pillar structures 152 may be formed to have a larger lateral dimension (e.g., diameter, length) compared to support pillar structures of conventional microelectronic device structures, without electrically shorting to the first conductive contact structures 150. In some embodiments, the first support pillar structures 152 exhibit a relatively larger lateral cross-sectional area than the second support pillar structures 154. The increased lateral dimension of the first conductive contact structures 150 facilitates a reduced amount of collapse of the first insulative structures 104 during the replacement gate processing acts described above.

In some embodiments, steps 142 of the first staircase region 115a including the first conductive contact structures 150 are located vertically (e.g., in the Z-direction) higher than the steps 142 of the second staircase region 115b. Forming the first conductive contact structures 150 simultaneously with formation of the conductive contacts 148 rather than during formation of the second conductive contact structures 175 may facilitate forming the first conductive contact structures 150 to have the smaller lateral dimensions $D_4$, $D_5$ than the second conductive contact structures 175. By way of comparison, formation of the first conductive contact structures 150 simultaneously with second conductive contact structures 175 may result in a reduction in polymer formation in the openings 144 (FIG. 1I) in which the first conducive contact structures 150 are formed, resulting in so-called "punch through" in which the openings 144 remove at least a portion of the vertically (e.g., in the Z-direction) uppermost step 142.

Figure 2:
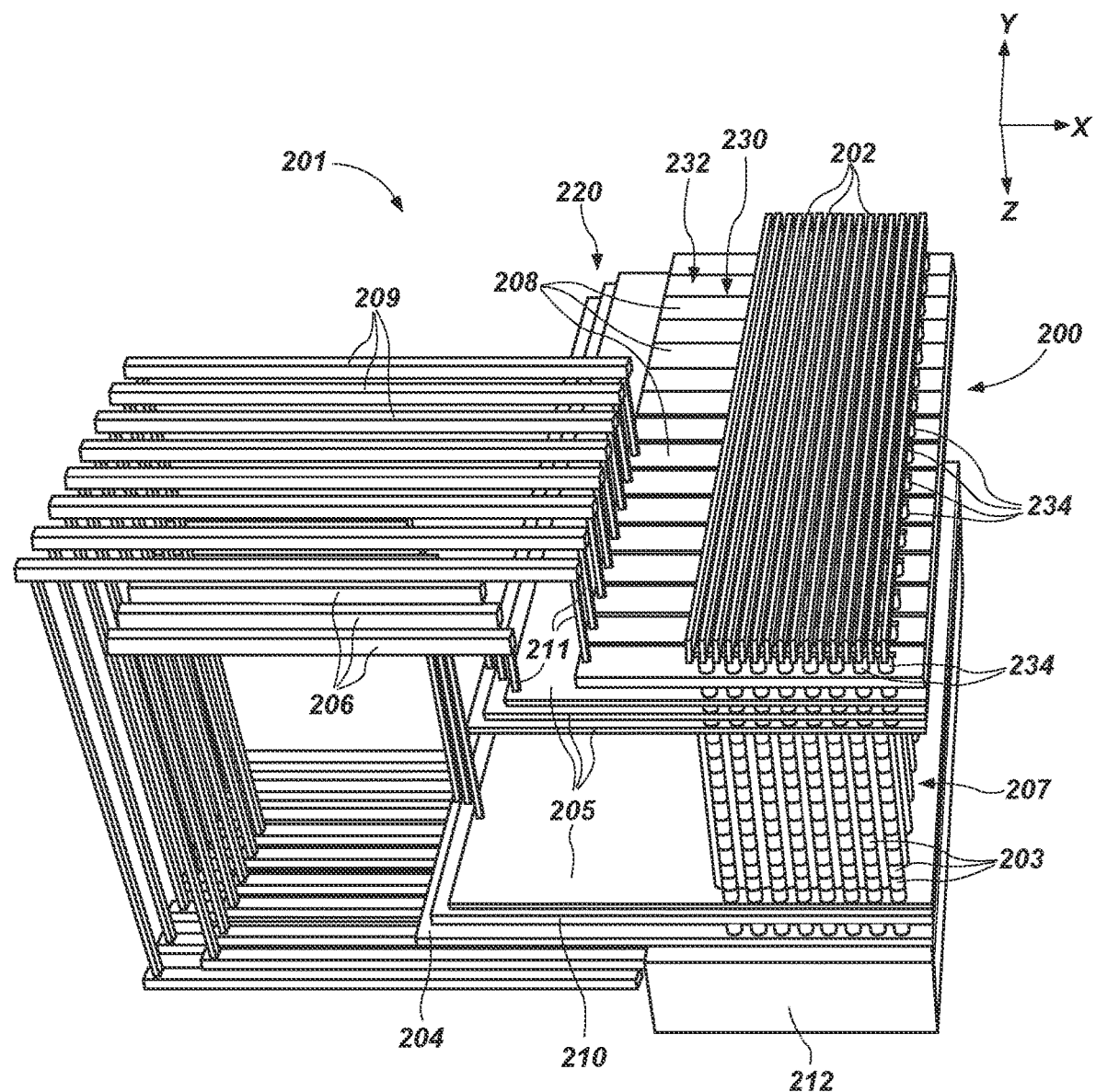
FIG. 2 is a partial cutaway perspective view of a microelectronic device, in accordance with embodiments of the disclosure.

FIG. 2 illustrates a partial cutaway perspective view of a portion of a microelectronic device 201 (e.g., a memory device, such as a dual deck 3D NAND Flash memory device) including a microelectronic device structure 200. The microelectronic device structure 200 may be substantially similar to the microelectronic device structure 100 following the processing stage previously described with reference to FIG. 1N and FIG. 1O. As shown in FIG. 2, the microelectronic device structure 200 may include a staircase structure 220 (e.g., including the staircase structures 140 of the first staircase region 115a, the second staircase region 115b, and the third staircase region 115c (FIG. 1N)) defining contact regions for connecting access lines 206 to conductive tiers 205 (e.g., conductive layers, conductive plates, such as the conductive structures 162 (FIG. 1N)). The microelectronic device structure 200 may include vertical strings 207 (e.g., strings 172 (FIG. 1N)) of memory cells 203 (e.g., memory cells 174 (FIG. 1N)) that are coupled to each other in series. The vertical strings 207 may extend vertically (e.g., in the Z-direction) and orthogonally to conductive lines and tiers 205, such as data lines 202, a source tier 204 (e.g., the source structure 110 (FIG. 1N)), the conductive tiers 205, the access lines 206, first select gates 208 (e.g., upper select gates, drain select gates (SGDs)), select lines 209, and a second select gate 210 (e.g., a lower select gate, a source select gate (SGS)). The select gates 208 may be horizontally divided (e.g., in the Y-direction) into multiple blocks 232 (e.g., block structures 164 (FIG. 1L, FIG. 1O)) horizontally separated (e.g., in the Y-direction) from one another by slot structures 230 (e.g., filled slots, such as the slot structures 160 (FIG. 1L, FIG. 1O) filled with one or more insulative materials).

Vertical conductive contacts 211 (e.g., the first conductive contact structures 150 (FIG. 1K, FIG. 1L), the second conductive contact structures 175 (FIG. 1N, FIG. 1O)) may electrically couple components to each other as shown. For example, the select lines 209 may be electrically coupled to the first select gates 208 and the access lines 206 may be electrically coupled to the conductive tiers 205. The microelectronic device 201 may also include a control unit 212 positioned under the memory array, which may include control logic devices configured to control various operations of other features (e.g., the strings 207 of memory cells 203) of the microelectronic device 201. By way of non-limiting example, the control unit 212 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control unit 212 may be electrically coupled to the data lines 202, the source tier 204, the access lines 206, the first select gates 208, and the second select gates 210, for example. In some embodiments, the control unit 212 includes CMOS (complementary metaloxide-semiconductor) circuitry. In such embodiments, the control unit 212 may be characterized as having a "CMOS under Array" ("CuA") configuration.

The first select gates 208 may extend horizontally in a first direction (e.g., the X-direction) and may be coupled to respective first groups of vertical strings 207 of memory cells 203 at a first end (e.g., an upper end) of the vertical strings 207. The second select gate 210 may be formed in a substantially planar configuration and may be coupled to the vertical strings 207 at a second, opposite end (e.g., a lower end) of the vertical strings 207 of memory cells 203.

The data lines 202 (e.g., digit lines, bit lines) may extend horizontally in a second direction (e.g., in the Y-direction) that is at an angle (e.g., perpendicular) to the first direction in which the first select gates 208 extend. The data lines 202 may be coupled to respective second groups of the vertical strings 207 at the first end (e.g., the upper end) of the vertical strings 207. A first group of vertical strings 207 coupled to a respective first select gate 208 may share a particular vertical string 207 with a second group of vertical strings 207 coupled to a respective data line 202. Thus, a particular vertical string 207 may be selected at an intersection of a particular first select gate 208 and a particular data line 202. Accordingly, the first select gates 208 may be used for selecting memory cells 203 of the strings 207 of memory cells 203.

The conductive tiers 205 (e.g., word line plates, such as the conductive structures 162 (FIG. 1N)) may extend in respective horizontal planes. The conductive tiers 205 may be stacked vertically, such that each conductive tier 205 is coupled to all of the vertical strings 207 of memory cells 203, and the vertical strings 207 of the memory cells 203 extend vertically through the stack of conductive tiers 205. The conductive tiers 205 may be coupled to or may form control gates of the memory cells 203 to which the conductive tiers 205 are coupled. Each conductive tier 205 may be coupled to one memory cell 203 of a particular vertical string 207 of memory cells 203.

The first select gates 208 and the second select gates 210 may operate to select a particular vertical string 207 of the memory cells 203 between a particular data line 202 and the source tier 204. Thus, a particular memory cell 203 may be selected and electrically coupled to a data line 202 by operation of (e.g., by selecting) the appropriate first select gate 208, second select gate 210, and conductive tier 205 that are coupled to the particular memory cell 203.

The staircase structure 220 may be configured to provide electrical connection between the access lines 206 and the tiers 205 through the vertical conductive contacts 211. In other words, a particular level of the tiers 205 may be selected via an access line 206 in electrical communication with a respective vertical conductive contact 211 in electrical communication with the particular tier 205.

The data lines 202 may be electrically coupled to the vertical strings 207 through conductive contact structures 234 (e.g., the conductive contacts 148 (FIG. 1N)).

Figure 3:
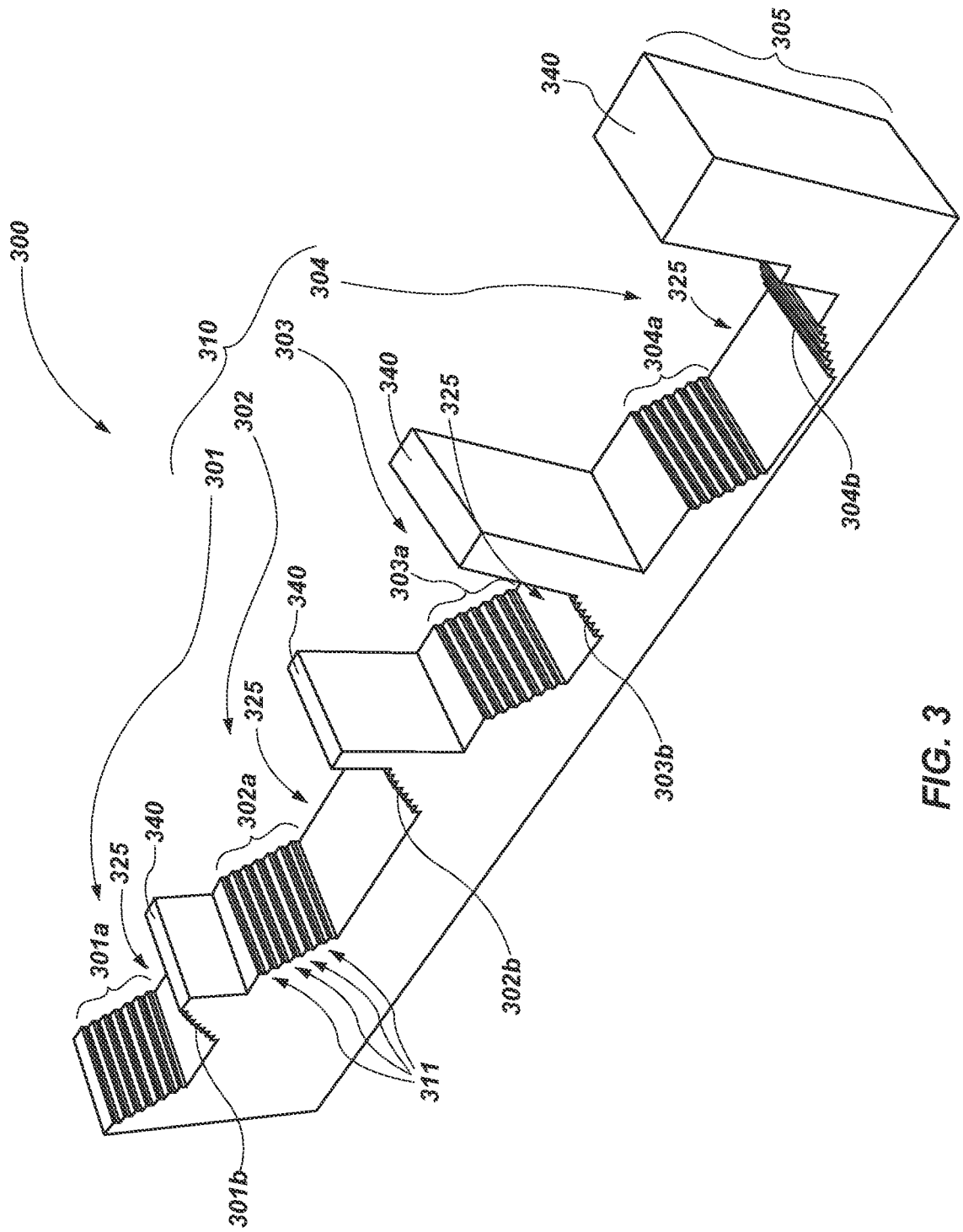
FIG. 3 is a simplified perspective view of a microelectronic device structure of the microelectronic device shown in FIG. 2, in accordance with embodiments of the disclosure.

FIG. 3 is a simplified perspective view of a microelectronic device structure 300, in accordance with embodiments of the disclosure. The microelectronic device structure 300 may, for example, be employed as the microelectronic device structure 200 of the microelectronic device 201 previously described with reference to FIG. 2 or the microelectronic device structure 100 previously described with reference to FIG. 1N and FIG. 1O. As shown in FIG. 3, the microelectronic device structure 300 may include a stack structure 305 (e.g., the stack structure 166 (FIG. 1N)) of vertically alternating conductive structures and insulative structures. The microelectronic device structure 300 may include one or more staircase structures 310 (e.g., the staircase structures 140 (FIG. 1N), the staircase structures 220 (FIG. 2)). Steps 311 of the staircase structure(s) 310 of the microelectronic device structure 300 may serve as contact regions for different tiers (e.g., conductive tiers 205 (FIG. 2)) of conductive materials (e.g., conductive structures 162 (FIG. 1H)) of the stack structure 305. The steps 311 may be located at horizontal ends of conductive structures (e.g., the conductive tiers 205) and insulative structures located between neighboring conductive structures.

The staircase structure(s) 310 may include, for example, a first stadium structure 301, a second stadium structure 302, a third stadium structure 303, and a fourth stadium structure 304. Each of the first stadium structure 301, the second stadium structure 302, the third stadium structure 303, and the fourth stadium structure 304 may include steps 311 at different elevations (e.g., vertical positions) relative to steps 311 of the other of the first stadium structure 301, the second stadium structure 302, the third stadium structure 303, and the fourth stadium structure 304. The first stadium structure 301 may include a first stair step structure 301a and an additional first stair step structure 301b; the second stadium structure 302 may include a second stair step structure 302a and an additional second stair step structure 302b; the third stadium structure 303 may include a third stair step structure 303a and an additional third stair step structure 303b; and the fourth stadium structure 304 may include a fourth stair step structure 304a and an additional fourth stair step structure 304b. The first stair step structure 301a, the second stair step structure 302a, the third stair step structure 303a, and the fourth stair step structure 304a may include steps 311 opposing and at the same elevation as the respective additional first stair step structure 301b, the additional second stair step structure 302b, the additional third stair step structure 303b, and the additional fourth stair step structure 304b. Each of the first stair step structure 301a, the second stair step structure 302a, the third stair step structure 303a, and the fourth stair step structure 304a may individually exhibit a generally negative slope; and each of the additional first stair step structure 301b, the additional second stair step structure 302b, the additional third stair step structure 303b, and the additional fourth stair step structure 304b may individually exhibit a generally positive slope.

As shown in FIG. 3, a valley 325 may be located between the first stair step structure 301a and the additional first stair step structure 301b; between the second stair step structure 302a and the additional second stair step structure 302b; between the third stair step structure 303a and the additional third stair step structure 303b; and between the fourth stair step structure 304a and the additional fourth stair step structure 304b.

A region between neighboring stadium structures (e.g., the first stadium structure 301, the second stadium structure 302, the third stadium structure 303, and the fourth stadium structure 304) may comprise an elevated region 340 (also referred to herein as a "crest region"). The elevated region 340 may be located between, for example, the first staircase region 115a (FIG. 1H) and the second staircase region 115b (FIG. 1H).

As described above, conductive contact structures (e.g., the first conductive contact structures 150 (FIG. 1K, FIG. 1L) and the second conductive contact structures (FIG. 1N, FIG. 1O), vertical conductive contacts 211 (FIG. 2)) may be formed to the electrically conductive portion of each tier (e.g., each step 311) of the stack structure 305 of the microelectronic device structure 300. In some embodiments, one or more of the stadium structures 301, 302, 303, 304 may include an additional slot structure (e.g., additional slot structure 180 (FIG. 1L)) between slot structures (e.g., slot structures 160 (FIG. 1L, FIG. 1O)). In some embodiments, only one of the stadium structures 301, 302, 303, 304 includes the additional slot structures and the other stadium structures 301, 302, 303, 304 include only slot structures. In some embodiments, a stadium structure having vertically higher (e.g., in the Z-direction) steps 311 (e.g., the stadium structure 301) may correspond to the first staircase region 115a (FIG. 1N) including the additional slot structures 180 (FIG. 1L) while the other stadium structures may correspond to other staircase regions (e.g., the second staircase region 115b (FIG. 1N)) not including the additional slot structures.

As will be understood by those of ordinary skill in the art, although the microelectronic device structure 200 (FIG. 2) and the microelectronic device structure 300 (FIG. 3) have been described as having particular structures, the disclosure is not so limited and the microelectronic device structures 200, 300 may have different geometric configurations and orientations.

Thus, in accordance with embodiments of the disclosure a microelectronic device comprises a stack structure comprising insulative structures vertically interleaved with conductive structures, first support pillar structures vertically extending through the stack structure in a first staircase region including steps defined at edges of tiers of the insulative structures and conductive structures, and second support pillar structures vertically extending through the stack structure in a second staircase region including additional steps defined at edges of additional tiers of the insulative structures and conductive structures, the second support pillar structures having a smaller cross-sectional area than the first support pillar structures.

Thus, in accordance with additional embodiments of the disclosure, a microelectronic device comprises a stack structure comprising a vertically alternating sequence of conductive structures and insulative structures arranged in tiers, an array region comprising strings of memory cells vertically extending through the stack structure, a first staircase region laterally neighboring the array region and comprising steps defined at lateral edges of some of the tiers of the conductive structures and the insulative structures, a second staircase region laterally neighboring the first staircase region and comprising additional steps defined at lateral edges of other of the tiers of the conductive structures and the insulative structures, first conductive contact structures in electrical communication with the steps of the first staircase region, and second conductive contact structures in electrical communication with the additional steps of the second staircase region, the second conductive contact structures having a larger dimension than the first conductive contact structures.

Thus in accordance with further embodiments of the disclosure, a method of forming a microelectronic device comprises forming pillars comprising a channel material in an array region of a stack structure, the stack structure comprising a vertically alternating sequence of insulative structures and additional insulative structures, forming an insulative material vertically overlying the pillars and vertically overlying a staircase region, the staircase region comprising a first staircase region laterally neighboring the array region and a second staircase region laterally neighboring the first staircase region, forming slots vertically extending through the stack structure, replacing, through the slots, each of the additional insulative structures with a conductive structure, filling the slots with a material to form slot structures, forming openings in the array region, each opening in the array region exposing a conductive material in electrical communication with a pillar of the pillars, forming additional openings in the first staircase region, each opening individually exposing a different conductive structure of the conductive structures, forming a conductive material in the openings to form conductive contacts in the array region, and forming a conductive material in the additional openings to form first conductive contact structures in the first staircase region.

Figure 4:
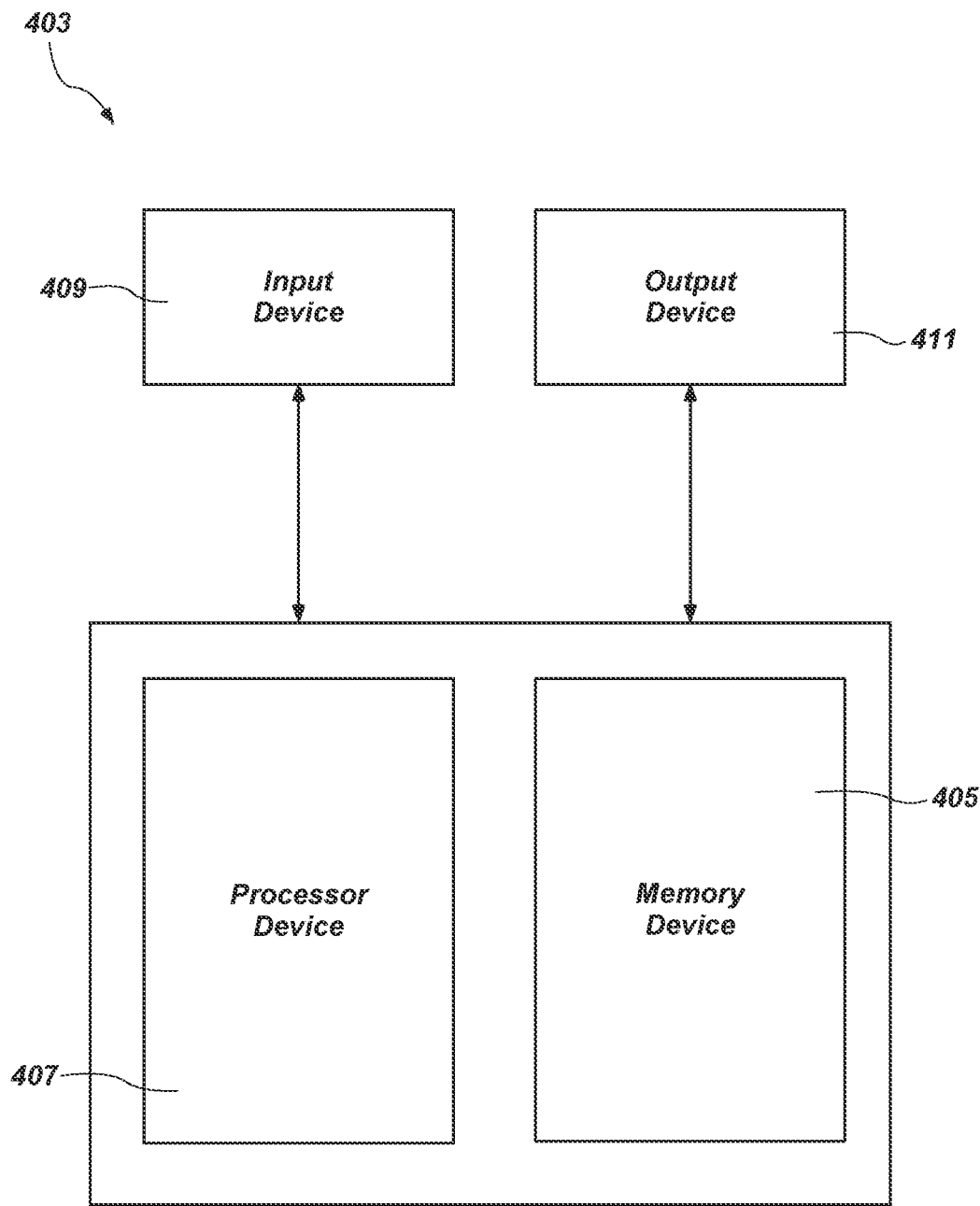
FIG. 4 is a block diagram of an electronic system, in accordance with embodiments of the disclosure.

Microelectronic devices including microelectronic devices (e.g., the microelectronic device 201) and microelectronic device structures (e.g., the microelectronic device structures 100, 200, 300) formed according to embodiments of the disclosure. For example, FIG. 4 is a block diagram of an electronic system 403, in accordance with embodiments of the disclosure. The electronic system 403 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 403 includes at least one memory device 405. The memory device 405 may include, for example, an embodiment of a microelectronic device structure previously described herein (e.g., the microelectronic device structure 100, 200, 300) or a microelectronic device (e.g., the microelectronic device 201 previously described with reference to FIG. 1A through FIG. 1J, FIG. 2, and FIG. 3). While the memory device 405 and the electronic signal processor device 407 are depicted as two (2) separate devices in FIG. 4, in additional embodiments, a single (e.g., only one) memory/processor device having the functionalities of the memory device 405 and the electronic signal processor device 407 is included in the electronic system 403. In such embodiments, the memory/processor device may include one or more of a microelectronic device structure (e.g., one of the microelectronic device structures 100, 200, 300) and a microelectronic device (e.g., the microelectronic device 201) previously described herein.

The electronic system 403 may further include at least one electronic signal processor device 407 (often referred to as a "microprocessor"). The electronic signal processor device 407 may, optionally, include an embodiment of one or more of a microelectronic device and a microelectronic device structure previously described herein. The electronic system 403 may further include one or more input devices 409 for inputting information into the electronic system 403 by a user, such as, for example, a mouse or other pointing device, a keyboard, a touchpad, a button, or a control panel. The electronic system 403 may further include one or more output devices 411 for outputting information (e.g., visual or audio output) to a user such as, for example, a monitor, a display, a printer, an audio output jack, a speaker, etc. In some embodiments, the input device 409 and the output device 411 may comprise a single touchscreen device that can be used both to input information to the electronic system 403 and to output visual information to a user. The input device 409 and the output device 411 may communicate electrically with one or more of the memory device 405 and the electronic signal processor device 407.

Figure 5:
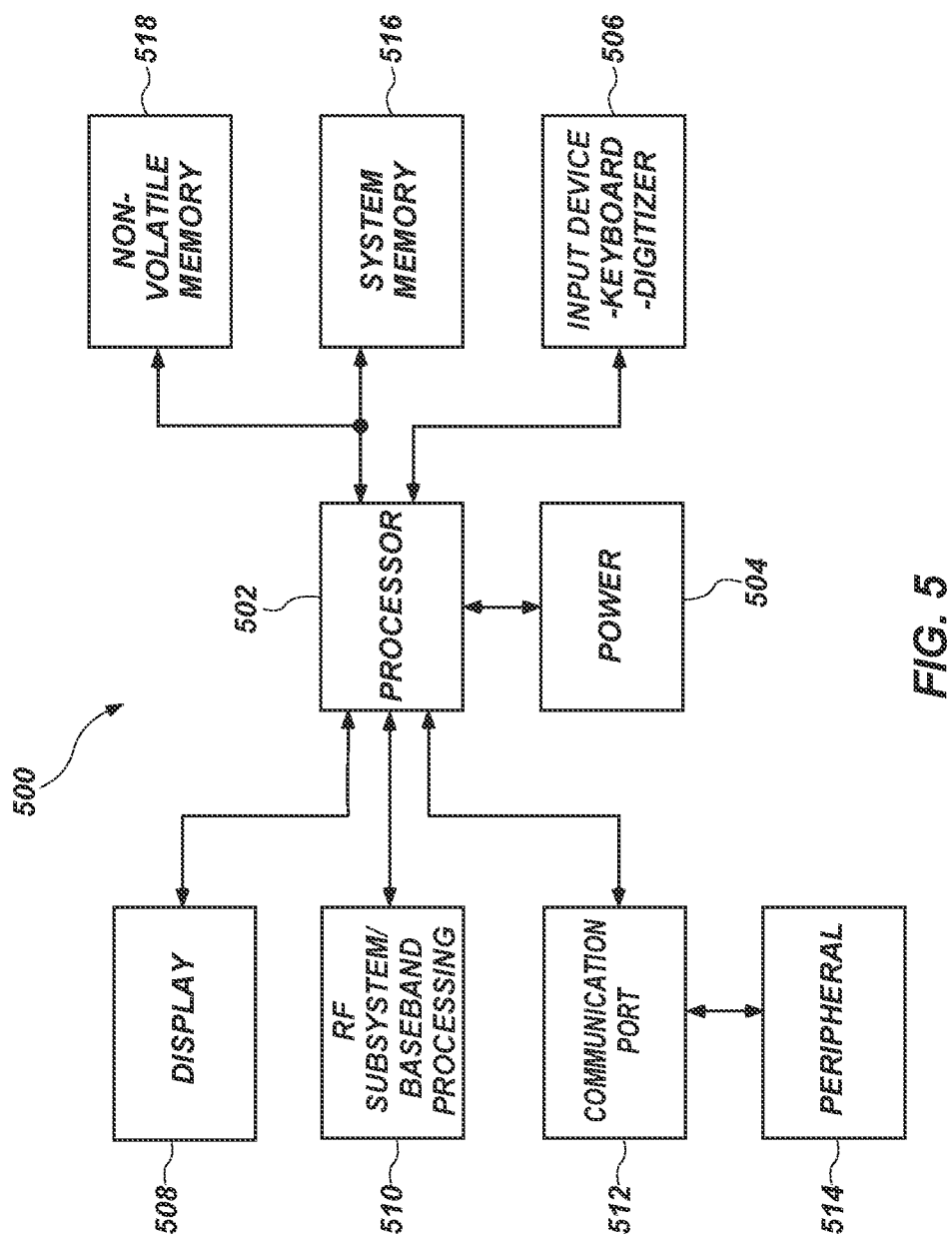
FIG. 5 is a block diagram of a processor-based system, in accordance with embodiments of the disclosure.

With reference to FIG. 5, depicted is a processor-based system 500. The processor-based system 500 may include one or more of a microelectronic device and a microelectronic device structure previously described herein and manufactured in accordance with embodiments of the disclosure. The processor-based system 500 may be any of a variety of types such as a computer, pager, cellular phone, personal organizer, control circuit, or other electronic device. The processor-based system 500 may include one or more processors 502, such as a microprocessor, to control the processing of system functions and requests in the processor-based system 500. The processor 502 and other subcomponents of the processor-based system 500 may include one or more of a microelectronic device and a microelectronic device structure previously described herein and manufactured in accordance with embodiments of the present disclosure.

The processor-based system 500 may include a power supply 504 in operable communication with the processor 502. For example, if the processor-based system 500 is a portable system, the power supply 504 may include one or more of a fuel cell, a power scavenging device, permanent batteries, replaceable batteries, and rechargeable batteries. The power supply 504 may also include an AC adapter; therefore, the processor-based system 500 may be plugged into a wall outlet, for example. The power supply 504 may also include a DC adapter such that the processor-based system 500 may be plugged into a vehicle cigarette lighter or a vehicle power port, for example.

Various other devices may be coupled to the processor 502 depending on the functions that the processor-based system 500 performs. For example, a user interface 506 may be coupled to the processor 502. The user interface 506 may include input devices such as buttons, switches, a keyboard, a light pen, a mouse, a digitizer and stylus, a touch screen, a voice recognition system, a microphone, or a combination thereof. A display 508 may also be coupled to the processor 502. The display 508 may include an LCD display, an SED display, a CRT display, a DLP display, a plasma display, an OLED display, an LED display, a three-dimensional projection, an audio display, or a combination thereof. Furthermore, an RF sub-system/baseband processor 510 may also be coupled to the processor 502. The RF sub-system/baseband processor 510 may include an antenna that is coupled to an RF receiver and to an RF transmitter (not shown). A communication port 512, or more than one communication port 512, may also be coupled to the processor 502. The communication port 512 may be adapted to be coupled to one or more peripheral devices 514, such as a modem, a printer, a computer, a scanner, or a camera, or to a network, such as a local area network, remote area network, intranet, or the Internet, for example.

The processor 502 may control the processor-based system 500 by implementing software programs stored in the memory. The software programs may include an operating system, database software, drafting software, word processing software, media editing software, or media playing software, for example. The memory is operably coupled to the processor 502 to store and facilitate execution of various programs. For example, the processor 502 may be coupled to system memory 516, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 516 may include volatile memory, non-volatile memory, or a combination thereof. The system memory 516 is typically large so that it can store dynamically loaded applications and data. In some embodiments, the system memory 516 may include semiconductor devices, such as one or more of a microelectronic device and a microelectronic device structure previously described herein.

The processor 502 may also be coupled to non-volatile memory 518, which is not to suggest that system memory 516 is necessarily volatile. The non-volatile memory 518 may include one or more of STT-MRAM, MRAM, read-only memory (ROM) such as an EPROM, resistive read-only memory (RROM), and flash memory to be used in conjunction with the system memory 516. The size of the non-volatile memory 518 is typically selected to be just large enough to store any necessary operating system, application programs, and fixed data. Additionally, the non-volatile memory 518 may include a high-capacity memory such as disk drive memory, such as a hybrid-drive including resistive memory or other types of non-volatile solid-state memory, for example. The non-volatile memory 518 may include microelectronic devices, such as one or more of a microelectronic device and a microelectronic device structure previously described herein.

Thus, in accordance with embodiments of the disclosure an electronic system comprises an input device, an output device, a processor device operably coupled to the input device and the output device, and a memory device operably coupled to the processor device and comprising at least one microelectronic device. The at least one microelectronic device comprises an array region comprising strings of memory cells vertically extending through a vertically alternating sequence of insulative structures and conductive structures, and a first staircase region laterally neighboring the array region, the first staircase region comprising first conductive contact structures vertically extending through a dielectric material overlying the first staircase region, each of the first conductive contact structures individually in electrical communication with a different conductive structure of the conductive structures. The first conductive contact structures each comprise a conductive liner material in contact with the dielectric material, and a conductive material in contact with the conductive liner material. The at least one microelectronic device structure further comprises a second staircase region laterally neighboring the first staircase region, the second staircase region comprising second conductive contact structures having a larger dimension than the first conductive contact structures, the second conductive contact structures vertically extending through the dielectric material, each of the second conductive contact structures individually in electrical communication with an additional conductive structure of the conductive structures. The second conductive contact structures each comprise an oxide liner material in contact with the dielectric material, a conductive liner material in contact with the oxide liner material, and a conductive material in contact with the conductive liner material.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
a stack structure comprising insulative structures vertically interleaved with conductive structures;
first support pillar structures vertically extending through the stack structure in a first staircase region including steps defined at edges of tiers of the insulative structures and conductive structures;
first conductive contact structures in electrical communication with some of the conductive structures of the stack structure at the steps of the first staircase region;
second support pillar structures vertically extending through the stack structure in a second staircase region including additional steps defined at edges of additional tiers of the insulative structures and conductive structures, each of the second support pillar structures having a smaller lateral cross-sectional area than each of the first support pillar structures; and
second conductive contact structures in electrical communication with some other of the conductive structures of the stack structure at the additional steps of the second staircase region, each of the second conductive contact structures having a larger lateral dimension than each of the first conductive contact structures.

2. The microelectronic device of claim 1, wherein the first support pillar structures exhibit an elliptical lateral cross-sectional shape and the second support pillar structures exhibit a circular lateral cross-sectional shape.

3. The microelectronic device of claim 1, wherein the first staircase region includes four of the first conductive contact structures for every one of the second conductive contact structures within the second staircase region.

4. The microelectronic device of claim 1, further comprising an array region laterally neighboring the first staircase region and including strings of memory cells vertically extending through the stack structure.

5. The microelectronic device of claim 4, further comprising a conductive contact in electrical communication with a channel region of one of the strings of memory cells.

6. The microelectronic device of claim 5, wherein a dimension of the conductive contact is substantially the same as a dimension of a first conductive contact structure in contact with a step of the first staircase region.

7. A memory device, comprising:
a stack structure comprising a vertically alternating sequence of conductive structures and insulative structures arranged in tiers,
the stack structure divided into block structures separated from one another by slot structures,
each of the block structures divided into sub-block structures separated from one another by additional slot structures within each array region and a first staircase region;
an array region comprising strings of memory cells vertically extending through the stack structure;
a first staircase region laterally neighboring the array region and comprising steps defined at lateral edges of some of the tiers of the conductive structures and the insulative structures;
a second staircase region laterally neighboring the first staircase region and comprising additional steps defined at lateral edges of other of the tiers of the conductive structures and the insulative structures, additional slot structures terminating at a boundary between the first staircase region and the second staircase region;
first conductive contact structures in electrical communication with the steps of the first staircase region; and
second conductive contact structures in electrical communication with the additional steps of the second staircase region, the second conductive contact structures having a larger dimension than the first conductive contact structures and laterally offset from the first conductive contact structures in a first lateral direction and a second lateral direction.

8. The memory device of claim 7, wherein each of the second conductive contact structures has a diameter greater than two times a diameter of each of the first conductive contact structures.

9. The memory device of claim 7, wherein lateral centers of some of the first conductive contact structures are laterally aligned with lateral centers of other of the first conductive contact structures in the first lateral direction and the second lateral direction.

10. The memory device of claim 7, wherein each step of each sub-block structure of the first staircase region is in electrical communication with one of the first conductive contact structures.

11. The memory device of claim 7, further comprising conductive contacts in electrical communication with the strings of memory cells, the conductive contacts having substantially the same lateral area as the first conductive contact structures.

12. The memory device of claim 7, further comprising an etch stop material comprising carbon doped silicon nitride over the strings of memory cells in the array region and laterally neighboring the conductive contacts in electrical communication with the strings of memory cells.

13. A memory device, comprising:
a stack structure comprising a vertically alternating sequence of conductive structures and insulative structures arranged in tiers;
an array region comprising strings of memory cells vertically extending through the stack structure;
a first staircase region laterally neighboring the array region and comprising steps defined at lateral edges of some of the tiers of the conductive structures and the insulative structures;
a second staircase region laterally neighboring the first staircase region and comprising additional steps defined at lateral edges of other of the tiers of the conductive structures and the insulative structures;
first conductive contact structures in electrical communication with the steps of the first staircase region;
second conductive contact structures in electrical communication with the additional steps of the second staircase region, the second conductive contact structures having a larger dimension than the first conductive contact structures;
first support pillar structures in the first staircase region; and
second support pillar structures in the second staircase region, each of the first support pillar structures has a lateral dimension larger than a lateral dimension of each of the second support pillar structures.

14. The memory device of claim 13, wherein:
the first support pillar structures individually exhibit an elliptical lateral cross-sectional shape; and
the second support pillar structures individually exhibit a circular lateral cross-sectional shape.

15. An electronic system, comprising:
an input device;
an output device;

a processor device operably coupled to the input device and the output device; and a memory device operably coupled to the processor device and comprising at least one microelectronic device structure, the at least one microelectronic device structure comprising:

an array region comprising strings of memory cells vertically extending through a vertically alternating sequence of insulative structures and conductive structures;

a first staircase region laterally neighboring the array region and comprising first conductive contact structures vertically extending through a dielectric material overlying the first staircase region, each of the first conductive contact structures individually in electrical communication with one of the conductive structures and comprising:

a conductive liner material in contact with the dielectric material; and a conductive material in contact with the conductive liner material;

a second staircase region laterally neighboring the first staircase region and comprising second conductive contact structures each having a larger dimension than each of the first conductive contact structures, the second conductive contact structures vertically extending through the dielectric material and individually in electrical communication with another one of the conductive structures, the second conductive contact structures each comprising:

an oxide liner material in contact with the dielectric material;

an additional conductive liner material in contact with the oxide liner material; and an additional conductive material in contact with the additional conductive liner material;

first support pillar structures vertically extending through portions of the vertically alternating sequence of insulative structures and conductive structures within the first staircase region; and second support pillar structures vertically extending through additional portions of the vertically alternating sequence of insulative structures and conductive structures within the second staircase region, at least one of the first support pillar structures having a larger lateral dimension than at least one of the second support pillar structures.

\* \* \* \* \*